United States Patent
Fan et al.

(10) Patent No.: US 11,632,512 B2
(45) Date of Patent: Apr. 18, 2023

(54) ARITHMETIC LOGIC UNIT DESIGN IN COLUMN ANALOG TO DIGITAL CONVERTER WITH SHARED GRAY CODE GENERATOR FOR CORRELATED MULTIPLE SAMPLINGS

(71) Applicant: OMNIVISION TECHNOLOGIES, INC., Santa Clara, CA (US)

(72) Inventors: Lihang Fan, Sunnyvale, CA (US); Min Qu, Mountain View, CA (US); Chao-Fang Tsai, San Jose, CA (US); Chun-Hsiang Chang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 240 days.

(21) Appl. No.: 17/180,520

(22) Filed: Feb. 19, 2021

(65) Prior Publication Data

US 2022/0269482 A1 Aug. 25, 2022

(51) Int. Cl.
*H04N 5/378* (2011.01)
*H03M 1/12* (2006.01)
*G06F 7/575* (2006.01)
*G06F 7/507* (2006.01)
*H03M 1/28* (2006.01)

(52) U.S. Cl.
CPC ............ *H04N 5/378* (2013.01); *G06F 7/507* (2013.01); *G06F 7/575* (2013.01); *H03M 1/12* (2013.01); *H03M 1/285* (2013.01)

(58) Field of Classification Search
CPC ........ H04N 5/335; H04N 5/341; H04N 5/345; H04N 5/347; H04N 5/378; H03M 1/12; H03M 1/285; G06F 7/507; G06F 7/575
See application file for complete search history.

(56) References Cited

U.S. PATENT DOCUMENTS

| | | | | |
|---|---|---|---|---|
| 2015/0138408 | A1* | 5/2015 | Lee | H04N 5/3575 348/294 |
| 2020/0153440 | A1* | 5/2020 | Sakurai | H04N 5/3575 |
| 2021/0329185 | A1* | 10/2021 | Fan | H03M 1/56 |
| 2022/0210359 | A1* | 6/2022 | Shikina | H04N 5/378 |

OTHER PUBLICATIONS

U.S. Appl. No. 16/854,765, Fan et al., filed Apr. 21, 2020, 71 pages.
Lim et al., "A 1.1e-Temporal Noise 1/3.2-inch 8Mpixel CMOS Image Sensor using Pseudo-Multiple Sampling," ISSCC 2010 / Session 22 / Image Sensors / 22.2, Feb. 10, 2010, 3 pages.

* cited by examiner

Primary Examiner — Lin Ye
Assistant Examiner — Chriss S Yoder, III
(74) Attorney, Agent, or Firm — Perkins Coie LLP

(57) ABSTRACT

An arithmetic logic unit (ALU) includes a front end latch stage coupled to latch Gray code (GC) outputs of a GC generator in response to a comparator output. A signal latch stage is coupled to latch outputs of the front end latch stage. A GC to binary stage is coupled to generate a binary representation of the GC outputs latched in the signal latch stage. First inputs of an adder stage are coupled to receive outputs of the GC to binary stage. Outputs of the adder stage are generated in response to the first inputs and second inputs of the adder stage. A pre-latch stage is coupled to latch outputs of the adder stage. A feedback latch stage is coupled to latch outputs of the pre-latch stage. The second inputs of the adder stage are coupled to receive outputs of the feedback latch stage.

31 Claims, 10 Drawing Sheets

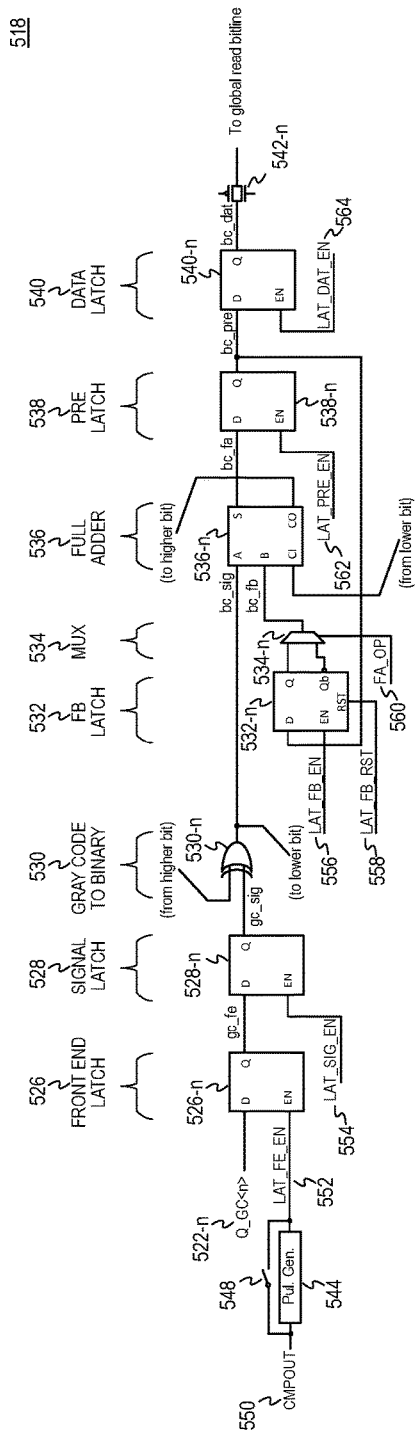

FIG. 5A

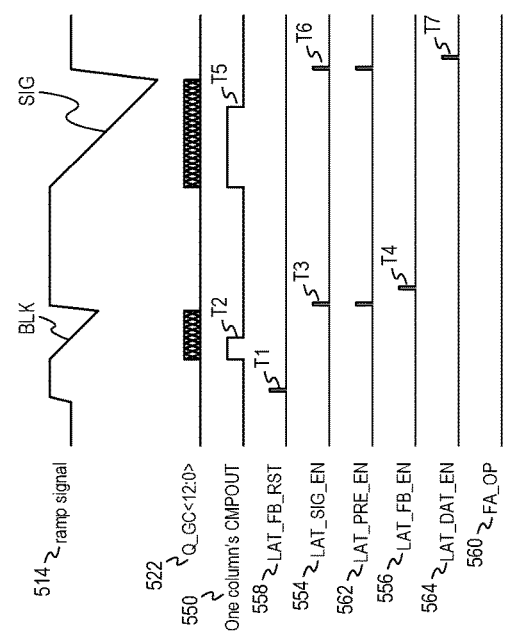

FIG. 5B

CDS: SIG - BLK

| time | Signal | description | data flow |
|---|---|---|---|
| T1 | LAT_FB_RST = 1 | To reset previous row's FB LATCH data. | bc_fb = 0 |
| T2 | CMPOUT 1 -> 0 | Black AD (BLK) value latched | gc_fe = BLK |
| T3 | LAT_SIG_EN = 1<br>LAT_PRE_EN = 1<br>FA_OP = 0 | BLK converts into Binary Code; FA does subtraction:<br>BLK-0 and this data stores into PRE LATCH | bc_pre = BLK |
| T4 | LAT_FB_EN = 1 | FB LATCH stores the data BLK | bc_fb = BLK |
| T5 | CMPOUT 1 -> 0 | Signal AD (SIG) value latched | gc_fe = SIG |
| T6 | LAT_SIG_EN = 1<br>LAT_PRE_EN = 1<br>FA_OP = 0 | SIG converts into Binary Code; FA does subtraction:<br>SIG-BLK and this data stores into PRE LATCH | bc_pre = SIG-BLK |
| T7 | LAT_DAT_EN = 1 | Final CDS data stores into DATA LATCH | bc_dat = SIG-BLK |

FIG. 5C

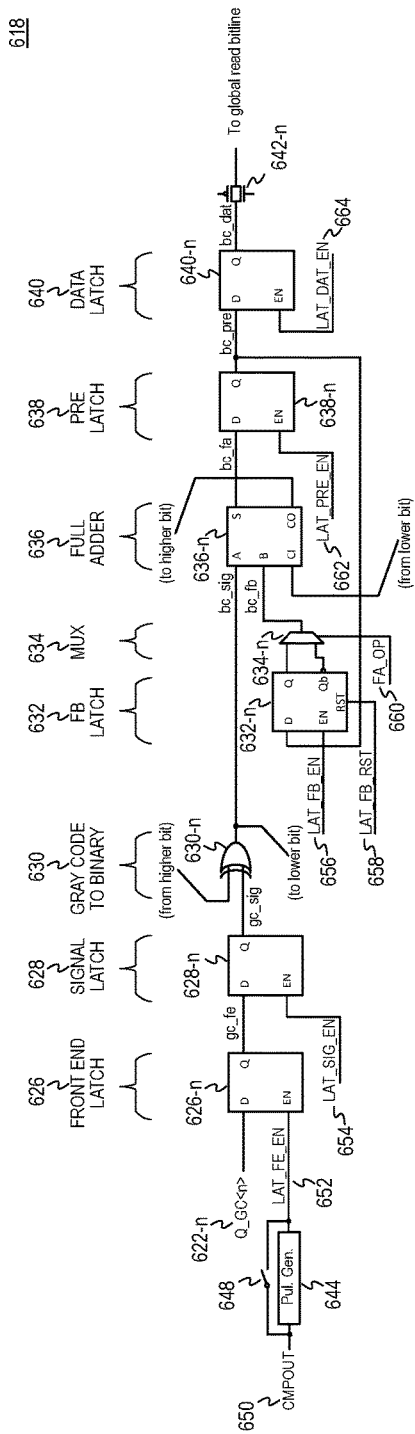
FIG. 6A
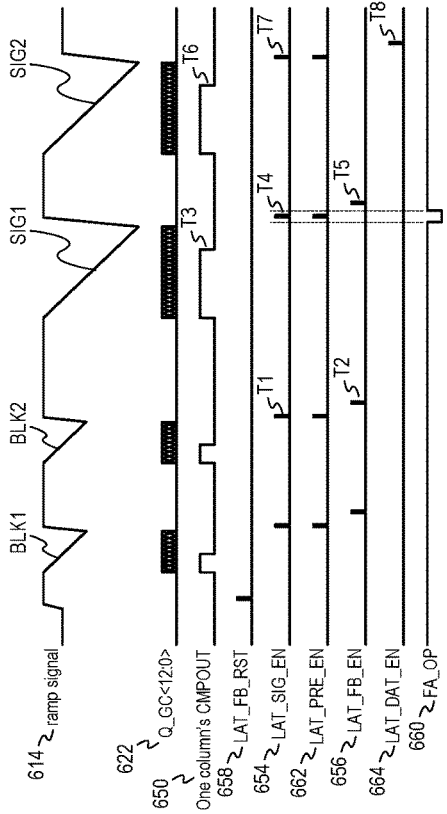
FIG. 6B
FIG. 6C

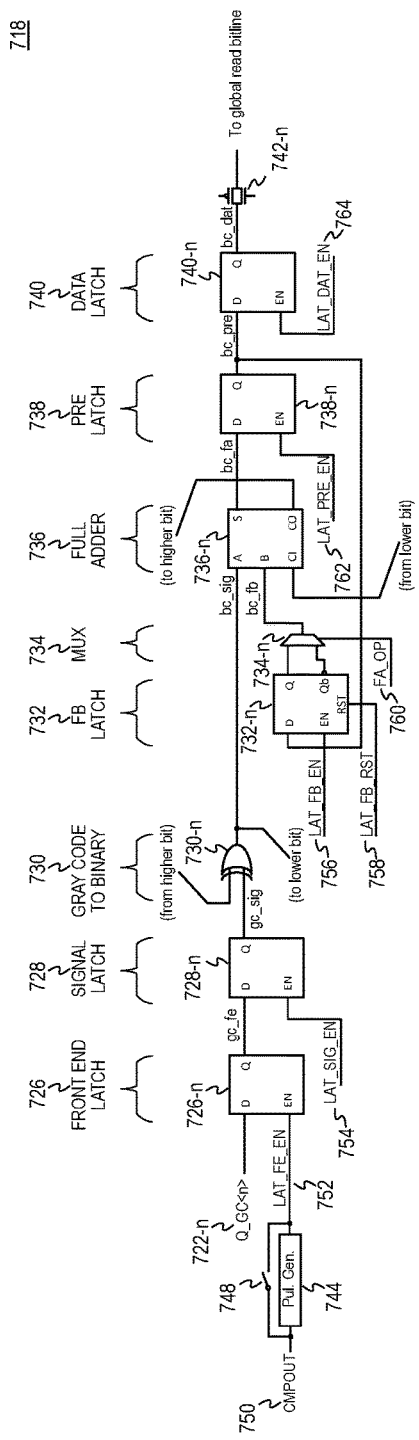
FIG. 7A
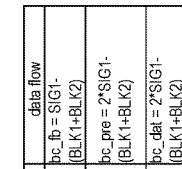
FIG. 7C
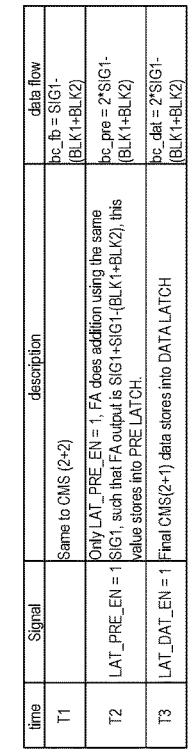
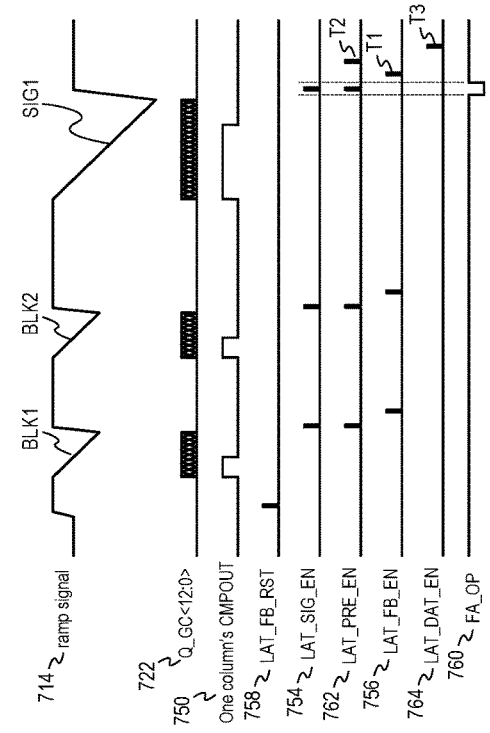
FIG. 7B

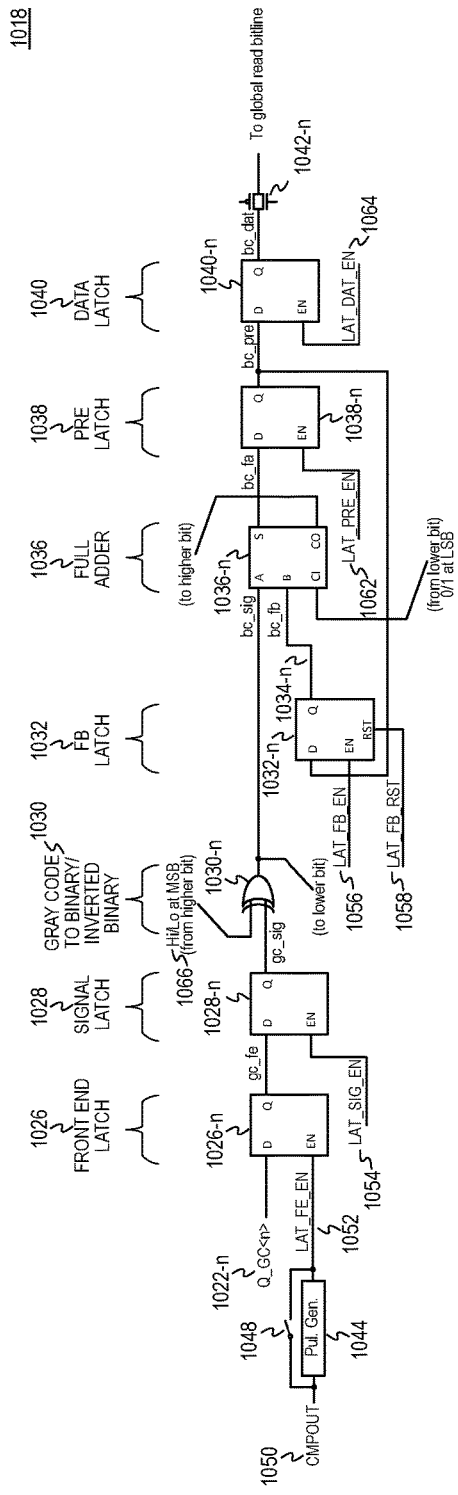
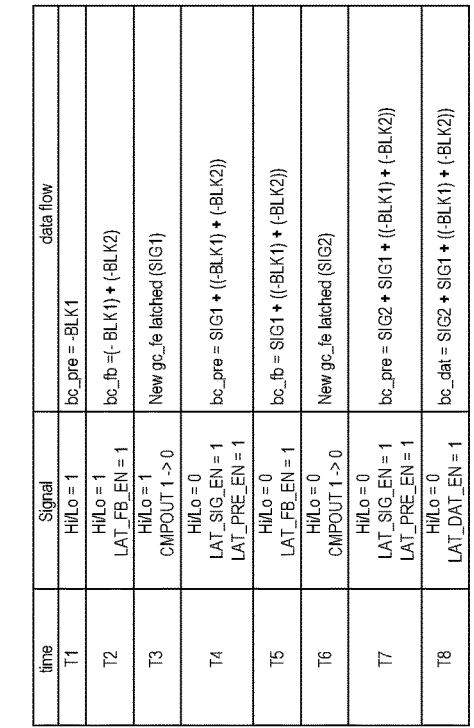
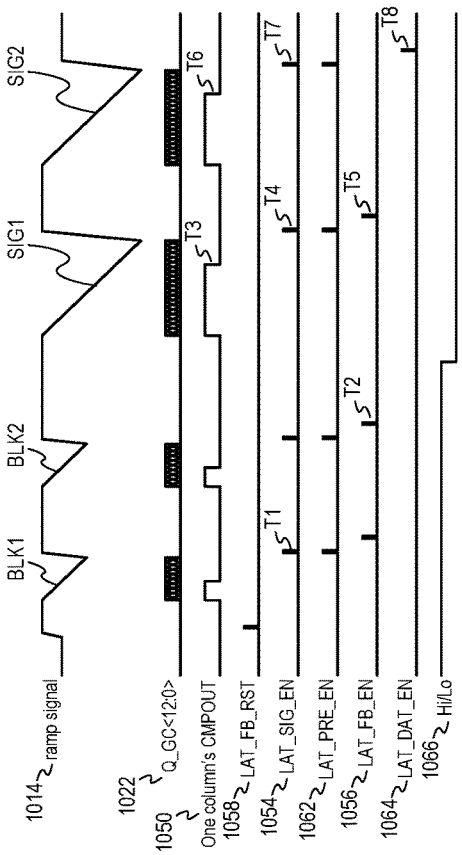
FIG. 10A
FIG. 10C
FIG. 10B

ARITHMETIC LOGIC UNIT DESIGN IN COLUMN ANALOG TO DIGITAL CONVERTER WITH SHARED GRAY CODE GENERATOR FOR CORRELATED MULTIPLE SAMPLINGS

BACKGROUND INFORMATION

Field of the Disclosure

This disclosure relates generally to image sensors, and in particular but not exclusively, relates to an arithmetic logic unit for use in analog to digital converters utilized in image sensors.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 5A-5C illustrate one example of timing and signal flow during an example correlated double sampling operation performed with an example arithmetic logic unit in accordance with the teachings of the present invention.

FIGS. 6A-6C illustrate one example of timing and signal flow during an example correlated multiple sampling operation performed with an example arithmetic logic unit in accordance with the teachings of the present invention.

FIGS. 7A-7C illustrate another example of timing and signal flow during another example of correlated multiple sampling operation performed with an example arithmetic logic unit in accordance with the teachings of the present invention.

FIGS. 10A-10C illustrate one example of timing and signal flow during an example correlated multiple sampling operation performed with an example arithmetic logic unit including one example of a Gray code to binary/inverted binary stage in accordance with the teachings of the present invention.

Figure 1:
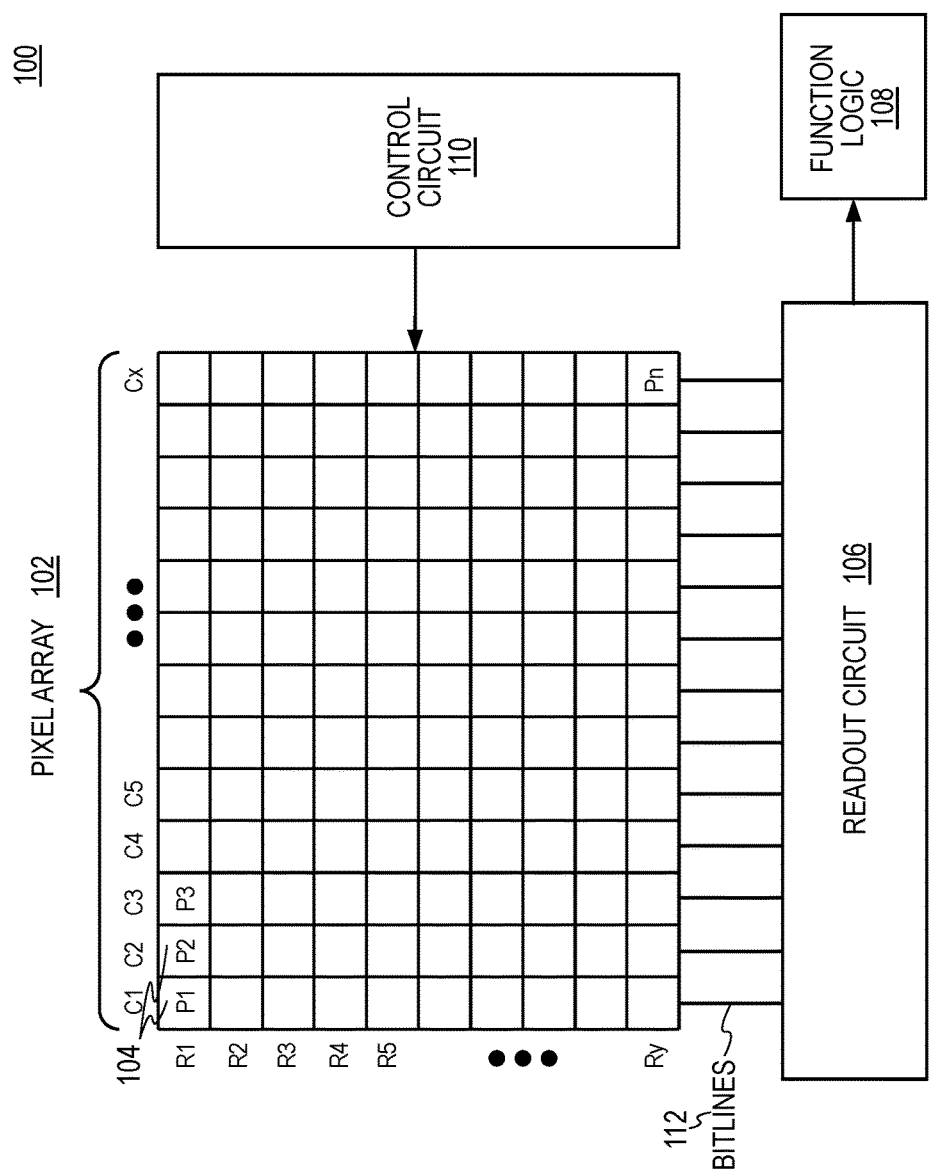
FIG. 1 illustrates one example of an imaging system including an image sensor with a readout circuit including a Gray code generator and parallel column arithmetic logic units in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to arithmetic logic units (ALUs) included in an analog to digital converter of an imaging system are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an image sensor readout circuit are disclosed in which analog image signals are read out in parallel from a pixel array through the column bit lines of an image sensor. In the various examples, each column bit line of the pixel array is coupled to one of the inputs of a respective comparator. The other input of each comparator is coupled to receive a global ramp signal. The output of each comparator is coupled to a respective column arithmetic logic unit (ALU) that is coupled to output digital or binary representations of the analog image signals from the pixel array. In various examples, the column ALUs are coupled to generate correlated double sampling (CDS) or correlated multiple sampling (CMS) outputs, which are based on a difference between an accumulated sum of one or more signal level samples and an accumulated sum of one or more black level samples of the image data that are read out from each of a plurality of pixel circuits of the pixel array. In the various examples, a shared Gray code (GC) generator is used to generate GC outputs that are coupled to be received by each of the column ALUs to perform parallel analog to digital conversion (ADC) of the image data read out from the column bit lines in accordance with teachings of the present invention.

To illustrate, FIG. 1 illustrates one example of an imaging system 100 including a pixel array 102 from which analog image signals are read out in parallel through column bit lines 112 to a readout circuit 106 in accordance with an embodiment of the present disclosure. As will be discussed in greater detail below, in various examples, readout circuit 106 includes circuitry to perform analog to digital conversion (ADC) of the image data from pixel array 102 with parallel arithmetic logic units (ALUs) and a shared Gray code (GC) generator for correlated double sampling (CDS) or correlated multiple sampling (CMS) in accordance with the teachings of the present invention.

In particular, the example depicted in FIG. 1 shows an imaging system 100 that includes pixel array 102, control circuit 110, readout circuit 106, and function logic 108. In one example, pixel array 102 is a two-dimensional (2D) array including a plurality of pixel circuits 104, which include photodiodes (e.g., P1, P2, . . . , Pn). As illustrated in the depicted example, the pixel circuits 104 are arranged into rows (e.g., R1 to Ry) and columns (e.g., C1 to Cx) to acquire image data of a person, place, object, etc., which can then be used to render an image of a person, place, object, etc.

In the example, each pixel circuit 104 is configured to photogenerate image charge in response to incident light. After each pixel circuit 104 has acquired its image charge, the corresponding analog image charge data is read out by readout circuit 106 through column bit lines 112. In the various examples, the image charge from each row of pixel circuits 104 is read out in parallel through column bit lines 112 by readout circuit 106. In the various examples, the analog image charge signals are converted to digital values, which are then transferred to function logic 108 in accordance with teachings of the present invention. In the various examples, the analog to digital conversion is performed with parallel ALUs and shared Gray code generator included in readout circuit 106. In various examples, the parallel ALUs readout included in readout circuit 106 are configured to perform correlated double sampling (CDS) or correlated multiple sampling (CMS) by finding the difference between an accumulated sum of one or more signal level samples and an accumulated sum of one or more black level samples from each of a plurality of pixel circuits 104 of the pixel array 102. The function logic 108 may store the image data or even manipulate the image data by applying post image effects (e.g., crop, rotate, remove red eye, adjust brightness, adjust contrast, or otherwise).

Figure 2:
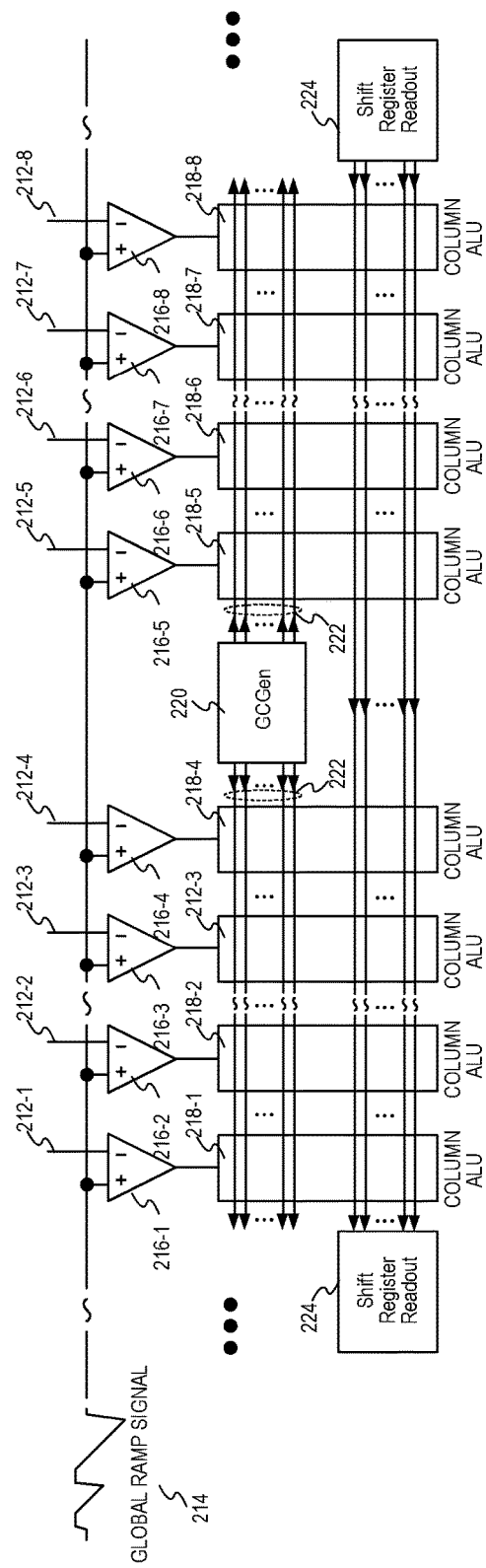
FIG. 2 illustrates a one example of a portion of a readout circuit including column analog to digital conversion with a Gray code generator and parallel column arithmetic logic units in accordance with the teachings of the present invention.

FIG. 2 illustrates a one example of a portion of a readout circuit 206 including column analog to digital conversion with a Gray code generator and parallel column arithmetic logic units (ALUs) in accordance with the teachings of the present invention. It is appreciated the readout circuit 206 of FIG. 2 may be one example of the readout circuit 106 of the image sensor 100 as shown in FIG. 1, and that similarly named and numbered elements described above are coupled and function similarly below.

As shown in the example depicted in FIG. 2, the portion of readout circuit 206 includes a plurality of comparators 216. Each one of the plurality of comparators 216 is coupled to receive a ramp signal 214, which in one example is a global ramp signal. Each one of the plurality of comparators 216 is further coupled to a respective one of a plurality of column bit lines 212 from an image sensor to receive a respective analog image data signal from a column of the image sensor. As shown in the example, the outputs of the plurality of comparators 216 are coupled in parallel to respective column ALUs 218. Each one of the plurality of ALUs 218 is also coupled to receive Gray code (GC) outputs 222 that are generated by a shared Gray code (GC) generator 220 as shown. In one example, the GC outputs 222 that are generated by the GC generator 220 are phase-aligned 13-bit Gray code signals.

In operation, each one of the plurality of comparators 216 is coupled to generate a respective comparator output in response to a comparison of the respective analog image data signal received from the respective bit line 212 and the ramp signal 214. In one example, when the voltage of the ramp signal 214 ramps down to a value equal to or less than the voltage of the analog image data signal carried by the respective column bit line 212, a falling edge occurs at the output of the respective comparator 216. In the example, each respective column ALU 218 is coupled to sample and hold, or latch, the 13-bit Gray code signal 222 received from the GC generator 220 when the falling edge occurs at the output of the respective comparator 216 that is coupled to the respective column ALU 218. As will be discussed, in the various examples, each column ALU 218 is then configured to perform Gray code to binary code conversion on the latched GC code signal 222.

In various examples, the column ALUs 218 may also be coupled perform correlated double sampling (CDS) or correlated multiple sampling (CMS) operations in parallel by determining a difference between an accumulated sum of sampled and held reset (SHR) values (which may also be referred to as black level samples in this disclosure) and an accumulated sum of one or more sampled and held signal (SHS) samplings (which may also be referred to as signal level samples in this disclosure) from the respective column bit lines 212 to generate normalized digital image signal data from the image sensor in accordance with the teachings of the present invention. In one example, the digital image signal data generated from the column ALUs 218 may then be output to respective global read bit lines of the readout circuit 206.

In one example, the portion of readout circuit 206 shown in FIG. 2 may be one of a plurality of portions of readout circuit 206 that are repeated or "stitched together" across the columns of an image sensor array. In the example shown in FIG. 2, the image signal outputs from the column ALUs 218 may therefore be relayed from "right" to "left" through the column ALUs 218 of each portion of readout circuit 206, and with shift register readouts 224 coupled to the first and last columns and interspersed between every N columns of the image sensor array, to readout out the image data from the image sensor array. For instance, in an example of a 48 megapixel sensor array, there are 8,000 columns. In the example, a single GC generator 220 may be shared among each N=500 columns of the sensor array, such that a total of 16x portions of readout circuit 206 shown in FIG. 2 are included between shift register readouts 224 coupled to the first and last columns and interspersed every 500 columns to readout the image signal outputs from the sensor array. In other words, shift readout registers 224 are coupled to respective ALUs 218 that are coupled to the first and last columns of the image sensor. In addition, shift registers 224 are coupled to and are interspersed between the plurality of ALUs 218 of each one of the plurality of readout circuits 206 to readout the respective digital image data signals from the plurality of ALUs 218.

Figure 3A:
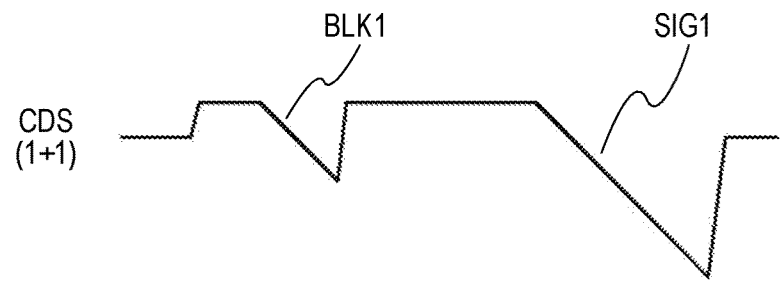
FIGS. 3A-3C illustrate various examples of global ramp signals provided during analog to digital conversions of one or more black level samples and one or more signal level samples during correlated double sampling or correlated multiple sampling operations of an imaging system in accordance with the teachings of the present invention.
Figure 3B:
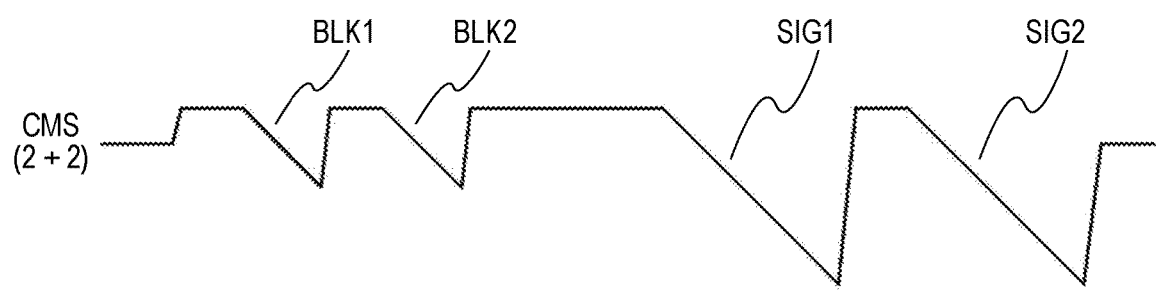
Figure 3C:
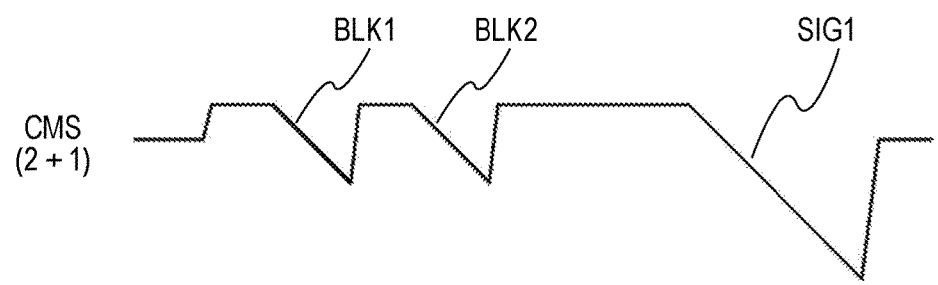

FIGS. 3A-3C illustrate various examples of global ramp signals provided during analog to digital conversions of one or more black level samples and one or more signal level samples during correlated double sampling or correlated multiple sampling operations of an imaging system in accordance with the teachings of the present invention.

For instance, FIG. 3A illustrates an example ramp signal 314A that is provided during the analog to digital conversion of one black level sample (e.g., "BLK") and one signal level sample (e.g., "SIG"). Thus, 2 (i.e., 1+1) samples are taken, and FIG. 3A therefore illustrates an example of ramp signal 314A of a correlated double sampling (CDS) operation, during which the difference between the one signal level sample SIG and the one black level sample BLK is determined (SIG−BLK) to generate the normalized output value for the image data received from the image sensor.

FIG. 3B illustrates an example ramp signal 314B that is provided during the analog to digital conversion of two black level samples (e.g., "BLK1" and "BLK2") and two signal level samples (e.g., "SIG1" and "SIG2"). Thus, 4 (i.e., 2+2) samples are taken, and FIG. 3B therefore illustrates an example of ramp signal 314B of a correlated multiple sampling (CMS) operation, during which the difference between the sum of the two signal level samples SIG1, SIG2 and the sum of the two black level samples BLK1, BLK2 is determined ((SIG1+SIG2)−(BLK1+BLK2)) to generate the normalized output value for the image data received from the image sensor. It is appreciated that a different number of samples may be taken and that with more black level samples and/or more signal level samples, better signal to noise ratios (SNR) can be achieved. However, with more samples being taken, the frame rate is lower.

FIG. 3C illustrates an example ramp signal 314C that is provided during the analog to digital conversion of two black level samples (e.g., "BLK1" and "BLK2") and one signal level samples (e.g., "SIG1"). Thus, 3 (i.e., 2+1) samples are taken, and FIG. 3C therefore illustrates an example of ramp signal 314C of a correlated multiple sampling (CMS) operation during which a different number of black level samples and signal level samples are taken. In the example depicted in FIG. 3C, the CMS operation determines the difference between the signal level samples SIG1 multiplied by two and the sum of the two black level samples BLK1, BLK2 to generate the normalized output value ((2*SIG1)−(BLK1+BLK2)) for the image data received from the image sensor.

Figure 4:
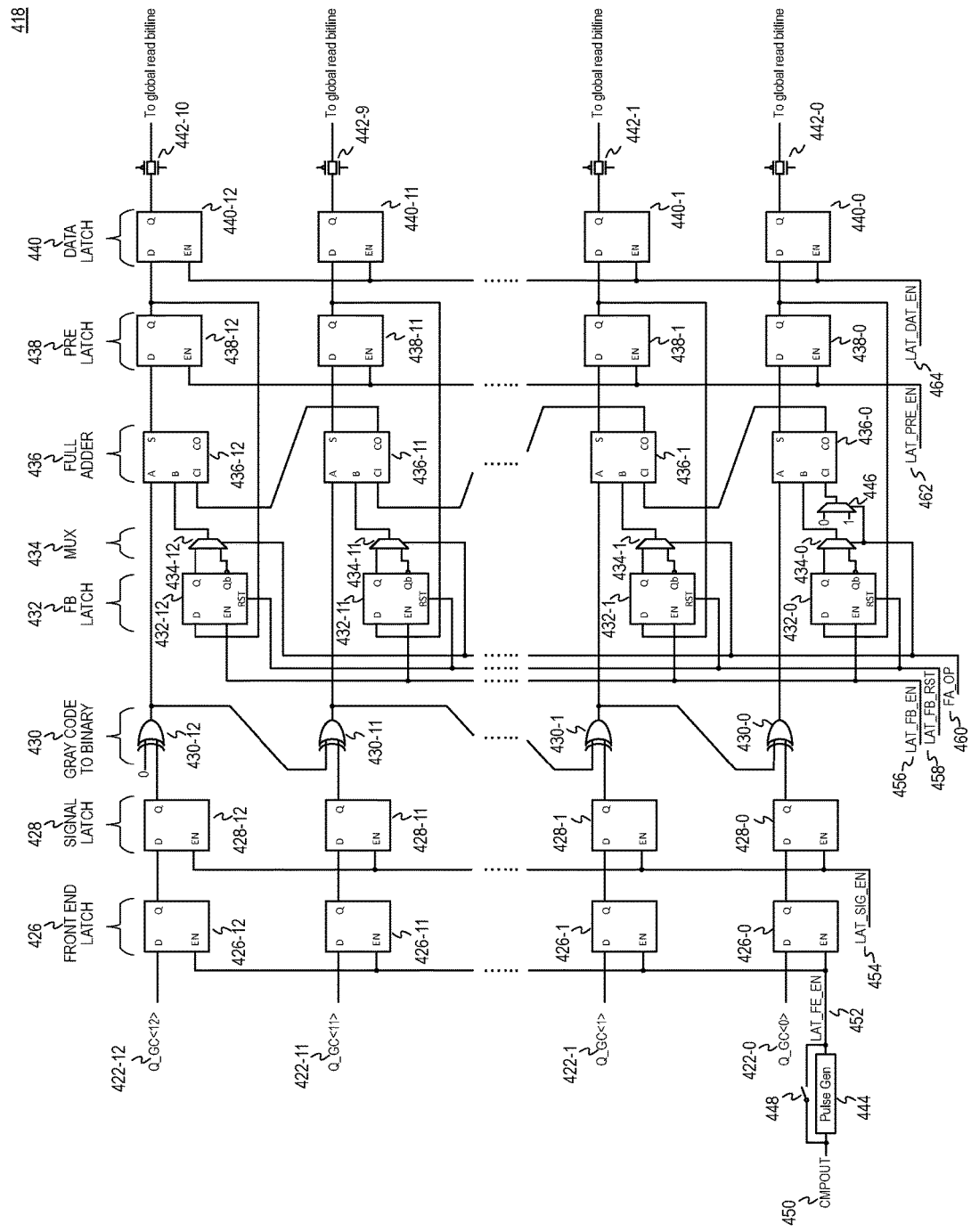
FIG. 4 is a schematic that illustrates one example of one of a plurality of arithmetic logic units in accordance with the teachings of the present invention.

FIG. 4 is a schematic that illustrates one example of one of a plurality of arithmetic logic units (ALUs) 418 in accordance with the teachings of the present invention. It is appreciated the ALU 418 of FIG. 4 may be one example of one of the plurality of column ALUs 218 as shown in FIG. 2, and that similarly named and numbered elements described above are coupled and function similarly below.

As will be shown below in the various examples, it is noted that each one of the plurality of ALUs 418 is coupled to sample and hold or latch the received 13-bit Gray code Q_GC<12:0> 422 in response to a comparator output COMPOUT 450. In one example, each ALU 418 is coupled to latch the 13-bit Gray code Q_GC<12:0> 422 in response to the arrival of a falling edge of comparator output COMPOUT 450 to complete the analog to digital conversion by converting the latched 13-bit Gray code Q_GC<12:0> 422 to a binary value.

In various examples, the plurality of ALUs 418 are further coupled to perform correlated double sampling (CDS) or correlated multiple sampling (CMS) in parallel by determining a difference between an accumulated sum of one or more signal level samples and an accumulated sum of one or more black level samples of the image data that are read out from each of a plurality of pixel circuits 104 of the pixel array 102 to generate a normalized digital or binary output value for the image data received from the image sensor. As will be shown, in an example of CDS, the difference between only one black level sample and only one signal level sample is determined. In an example of CMS, the difference between an accumulated sum of one or more black level samples and an accumulated sum of one or more signal level samples is determined.

To illustrate, the example ALU 418 shown in FIG. 4 includes a front end latch stage 426 coupled to receive and latch Gray code Q_GC<12:0> 422 signal values in response to comparator output 450. In the illustrated example, front end latch stage 426 includes a plurality of latches 426-0 to 426-12, each of which has a data input "D" coupled to receive a respective bit of Gray code Q_GC<12:0> 422.

In the example, ALU 418 also includes a pulse generator 444 that is coupled to receive the comparator output 450 from the respective comparator (e.g., comparator 216) of the column. In one example, the pulse generator 444 is coupled to generate a front end latch enable signal LAT_FE_EN 452 in response to the arrival of a falling edge in the comparator output CMPOUT 450. In one example, the pulse of front end latch enable signal LAT_FE_EN 452 is coupled to an enable input of each one of the plurality of latches 426-0 to 426-12 of front end latch stage 426.

In one example, ALU 418 also includes a bypass switch 448 coupled between the input and output of pulse generator 444 of FIG. 4 to implement a bypass mode. One reason for the bypass mode is because in various examples, the pulse generator 444 may be sensitive to noise in the VDD supply and/or noise in ground, which may cause unwanted image artifacts. Thus, in excessively noisy conditions, it may be desirable to bypass the pulse generator 444. In operation, when bypass switch 448 is closed, the bypass mode is enabled. When the bypass mode is enabled, the front end latch enable signal LAT_FE_EN 452 is substantially the same or substantially equal to the comparator output COMPOUT 450. When the bypass switch 448 is opened, the bypass mode is disabled. When the bypass mode is disabled, the front end latch enable signal LAT_FE_EN 452 is substantially the same or substantially equal to the output pulse from the pulse generator 444.

In the depicted example, ALU 418 also includes a signal latch stage 428 coupled to the output of the front end latch stage 426. In operation, the signal latch stage 428 is coupled to latch outputs of the front end latch stage 426 in response to a signal latch enable signal LAT_SIG_EN 454. In the depicted example, the signal latch stage 428 includes a plurality of latches 428-0 to 428-12. Each one of the plurality of latches 428-0 to 428-12 has a data input "D" coupled to the "Q" output of a respective one of a plurality of latches 426-0 to 426-12 of the front end latch stage 426. Each one of the plurality of latches 428-0 to 428-12 has an enable input "EN" coupled to receive the signal latch enable signal LAT_SIG_EN 454.

The example in FIG. 4 shows that ALU 418 also includes a GC to binary stage 430 that is coupled to generate binary representations of the Gray code Q_GC<12:0> 422 signal values latched in the front end latch stage 426. In the illustrated example, GC to binary stage 430 includes a plurality of exclusive-OR (XOR) gates 430-0 to 430-12, each of which has an output coupled to generate the corresponding binary bit, and a first input coupled to receive a respective "Q" output of the plurality of latches 428-0 to 428-12 of signal latch stage 428. Assuming that the Gray code Q_GC<12:0> 422 signal values have N bits, where Gray code Q_GC<12> 422-12 is the most significant bit (MSB) and Gray code Q_GC<11:0> are the N−1 least significant bits (LSBs), each one of the plurality of XOR gates 430-0 to 430-11 that corresponds to one of the N−1 LSBs has a second input coupled to receive respective outputs of nearest neighboring XOR gates of GC to binary stage 430 corresponding to a higher bit value as shown. In the example depicted in FIG. 4, the second input of the XOR gate 430-12, which corresponds to the MSB, is coupled to receive a logic low level (e.g., "0").

As shown in the depicted example depicted in FIG. 4, the ALU 418 also includes an adder stage 436, which includes a plurality of full adders 436-0 to 436-12, each of which having a first input "A" coupled to an output of the GC to binary stage 430, and a second input "B" coupled to an output of a multiplexer stage 434, which will be described in greater detail below. In operation, outputs "S" of the adder stage are generated in response to the first inputs "A" and the second inputs "B" of the adder stage 436, which in the example is the sum of the values received at the first inputs "A" and the values received at second inputs "B."

The example in FIG. 4 shows that ALU 418 also includes a pre-latch stage 438 coupled to latch outputs of the adder stage 436 in response to a pre-latch enable signal LAT_PRE_EN 462. In the depicted example, the pre-latch stage 438 includes a plurality of latches 438-0 to 438-12. Each one of the plurality of latches 438-0 to 438-12 has a data input "D" coupled to the "S" output of a respective one of the plurality of full adders 436-0 to 436-12 of the adder stage 436. Each one of the plurality of latches 438-0 to 438-12 has an enable input "EN" coupled to receive the pre-latch enable signal LAT_PRE_EN 462.

The example in FIG. 4 shows that ALU 418 also includes a feedback latch stage 432 coupled to latch outputs of the pre-latch stage 438 in response to a feedback latch enable signal LAT_FB_EN 456. In the depicted example, the feedback latch stage 432 includes a plurality of latches 432-0 to 432-12. Each one of the plurality of latches 432-0 to 432-12 of the feedback latch stage 432 has a data input "D" coupled to the "Q" output of a respective one of the plurality of latches 438-0 to 438-12 of the pre-latch stage 438. Each one of the plurality of latches 432-0 to 432-12 has an enable input "EN" coupled to receive the feedback latch enable signal LAT_FB_EN 456 and a reset input coupled to receive a feedback latch reset signal LAT_FB_RST 458. In the various examples, the feedback latch stage 432 can be reset (e.g., zeroed) in response to the feedback latch reset signal LAT_FB_RST 458. As shown in the example, the outputs of the feedback latch stage 432 include first outputs "Q" and second outputs "Qb." The first outputs "Q" of the feedback latch stage 432 are the latched outputs of the pre-latch stage 438. The second outputs "Qb" of the feedback latch stage 432 are inverted latched outputs of the pre-latch stage 438.

The example in FIG. 4 shows that ALU 418 also includes the multiplexer stage 434 coupled between the feedback latch stage 432 and the adder stage 436. In operation, the multiplexer stage 434 is configured to select either the first outputs "Q" or the second outputs "Qb" of the feedback latch stage 432 to be coupled to the second inputs "B" of the adder stage 436 in response to an adder operation signal FA_OP 460. Therefore, it is appreciated that the feedback latch stage 432 is configured to feed back the "S" outputs of the adder stage 436 back into the second input "B" of the adder stage 436 through the pre-latch stage 438. In so doing, the sums generated by the adder stage 436 can be accumulated in the pre-latch stage 438 and then transferred to the feedback latch stage 432 over multiple summing operations of adder stage 436 between resets of the feedback latch stage 432 in accordance with the teachings of the present invention. In the various examples, the pre-latch stage 438 and the feedback latch stage 432 are configured to be controlled by different enable signals with different timing to avoid oscillations.

As shown in the depicted example, the LSB of the adder stage 436 is full adder 436-0. In the example, the carry-in "CI" input of full adder 436-0 is coupled to an output of a multiplexer 446. In operation, the multiplexer 446 is configured to select either a low value or a high value (e.g., "0" or "1") to be coupled to be received by the carry-in "CI" input of full adder 436-0 in response to the adder operation signal FA_OP 460.

Thus, in operation, the carry-in "CI" input of full adder 436-0 is coupled to receive a low value (e.g., "0") from multiplexer 446 when the second inputs "B" of the adder stage 436 are coupled to receive the first outputs "Q" from the feedback latch stage 432 through multiplexer stage 434. Similarly, the carry-in "CI" input of full adder 436-0 is coupled to receive a high value (e.g., "1") from multiplexer 446 when the second inputs "B" of the adder stage 436 are coupled to receive the second outputs "Qb" from the feedback latch stage 432 through multiplexer stage 434.

Accordingly, it is appreciated that the adder stage 436 is configured to add a feedback value latched in the feedback latch stage 432 and the binary representation of the GC outputs latched in the signal latch stage 428 through GC to binary stage 430 when the multiplexer stage 434 is configured to couple the first outputs "Q" of the feedback latch stage 432 to the second inputs "B" of the adder stage 436. Similarly, the adder stage 436 is configured to add a two's complement representation of a feedback value latched in the feedback latch stage 432 and the binary representation of the GC outputs latched in the signal latch stage 428 through the GC to binary stage 430 when the multiplexer stage 434 is configured to couple the second outputs "Qb" of the feedback latch stage 432 to the second inputs "B" of the adder stage 436. It is appreciated of course that the two's complement representation of the feedback value latched in the feedback latch stage 432 is the inverted binary representation (e.g., the inverted "Qb" output) plus one, which can be realized by setting the carry-in "CI" input of full adder 436-0 to receive a high value (e.g., "1") from multiplexer 446. As a result, the adder stage 436 can perform subtraction by adding a negative representation of a number (e.g., the two's complement representation) to another number.

Continuing with the illustrated example, ALU 418 also includes a data latch stage 440 coupled between the pre-latch stage 438 and an ALU output of the ALU 418. In operation, the data latch stage 440 is coupled to latch the output of the pre-latch stage 438 in response to a data latch enable signal LAT_DAT_EN 464. In the illustrated example, data latch stage 440 includes a plurality of latches 440-0 to 462-12, each of which has a data input "D" coupled to receive a respective output "Q" from pre-latch stage 438. In addition, each of the plurality of latches 440-0 to 440-12 includes an enable input "EN" coupled to receive the data latch enable signal LAT_DAT_EN 464.

In the depicted example, a plurality of transmission gates 442-0 to 442-12 are coupled between the respective "Q" outputs of the plurality of latches 440-0 to 440-12 and the ALU output. In one example, the ALU output is coupled to a global read bitline. In one example, the ALU output is coupled to a global read bitline via a shift register readout, such as for example as illustrated and described in FIG. 2 above.

FIGS. 5A-5C illustrate an example of timing and signal flow during an example correlated double sampling operation (CDS) performed with an example arithmetic logic unit 518 in accordance with the teachings of the present invention. It is appreciated that FIG. 5A illustrates one bit of an ALU 518, which may be one example of one of the bits of ALU 418 as shown in FIG. 4, and that similarly named and numbered elements described above are coupled and function similarly below.

For instance, as shown in FIG. 5A, ALU 518 includes a front end latch stage 526 coupled to receive and latch a Gray code bit Q_GC 522-n signal value in response to comparator output 550. ALU 518 also includes a pulse generator 544 that is coupled to receive the comparator output 550 from the respective comparator (e.g., comparator 216) of the column. In one example, the pulse generator 544 is coupled to generate a front end latch enable signal LAT_FE_EN 552 in response to the arrival of a falling edge in the comparator output CMPOUT 550. In one example, ALU 518 also includes a bypass switch 548 coupled between the input and output of pulse generator 544.

In the depicted example, ALU 518 also includes a signal latch stage 528 coupled to the output of the front end latch stage 526. In operation, the signal latch stage 528 is coupled to latch outputs of the front end latch stage 526 in response to a signal latch enable signal LAT_SIG_EN 554. ALU 518 also includes a GC to binary stage 530 that is coupled to generate binary representations of the Gray code bit Q_GC 522 signal value latched in the front end latch stage 526.

In the example, the ALU 518 also includes an adder stage 536, which includes a full adder 536-n having a first input "A" coupled to an output of the GC to binary stage 530, a second input "B" coupled to an output of a multiplexer stage 534. In operation, output "S" of the adder stage is generated in response to the first input "A" and the second input "B" of the adder stage 536, which in the example is the sum of the values received at the first inputs "A" and the values received at second inputs "B."

In the depicted example, ALU 518 also includes a pre-latch stage 538 coupled to latch output of the adder stage 536 in response to a pre-latch enable signal LAT_PRE_EN 562. The ALU 518 also includes a feedback latch stage 532 coupled to latch the output of the pre-latch stage 538 in response to a feedback latch enable signal LAT_FB_EN 556. In the various examples, the feedback latch stage 532 can be reset (e.g., zeroed) in response to the feedback latch reset signal LAT_FB_RST 558. As shown in the example, the outputs of the feedback latch stage 532 include a first output "Q" and a second output "Qb." The first output "Q" of the feedback latch stage 532 is the latched output of the pre-latch stage 538. The second output "Qb" of the feedback latch stage 532 is an inverted latched output of the pre-latch stage 538.

In the example, ALU 518 also includes the multiplexer stage 534 coupled between the feedback latch stage 532 and the adder stage 536. In operation, the multiplexer stage 534 is configured to select either the first output "Q" or the second output "Qb" of the feedback latch stage 532 to be coupled to the second input "B" of the adder stage 536 in response to an adder operation signal FA_OP 560. Therefore, it is appreciated that the feedback latch stage 532 is configured to feed back the "S" output of the adder stage 536 back into the second input "B" of the adder stage 536 through pre-latch stage 538. In so doing, the sums generated by the adder stage 536 can be accumulated in the pre-latch stage 538 and then transferred to the feedback latch stage 532 over multiple summing operations of adder stage 536 between resets of the feedback latch stage 532 in accordance with the teachings of the present invention.

As discussed above, it is appreciated that the adder stage 536 is configured to perform addition by adding a feedback value latched in the feedback latch stage 532 and the binary representation of the GC outputs latched in the signal latch stage 528 through GC to binary stage 530 when the multiplexer stage 534 is configured to couple the first outputs "Q" of the feedback latch stage 532 to the second inputs "B" of the adder stage 536. Similarly, the adder stage 536 is configured to perform subtraction by adding the two's complement representation of a feedback value latched in the feedback latch stage 532 and the binary representation of the GC outputs latched in the signal latch stage 528 through the GC to binary stage 530 when the multiplexer stage 534 is configured to couple the second outputs "Qb" of the feedback latch stage 532 to the second inputs "B" of the adder stage 536.

Continuing with the illustrated example, ALU 518 also includes a data latch stage 540 coupled between the pre-latch stage 538 and an ALU output of the ALU 518. In operation, the data latch stage 540 is coupled to latch the output of the pre-latch stage 438 in response to a data latch enable signal LAT_DAT_EN 564. In addition, ALU 518 also includes a transmission gate 542-$n$ coupled between the respective "Q" output of the data latch stage 540 and the ALU output. In one example, the ALU output is coupled to a global read bitline.

As shown in the example depicted in FIG. 5B, ramp signal 514 includes one black level sample event BLK and one signal level sample event SIG. As such, a correlated double sampling (CDS) operation is performed such that the difference between the signal level sample the black level sample (SIG−BLK) is determined by ALU 518.

The example depicted in FIG. 5B shows that processing begins at time T1 with the feedback latch reset signal LAT_FB_RST 558 being pulsed to reset the feedback latch stage 532 and zero out any previous data latched in the feedback latch stage 532. Next the comparator output signal CMPOUT 550 pulses at time T2 as the ramp signal 514 ramps down, which causes the front end latch stage 526 to latch the black level sample value BLK as represented Gray code signal Q_GC<12:0> 522.

At time T3, the signal latch enable signal LAT_SIG_EN 554 and pre-latch enable signal LAT_PRE_EN 562 are pulsed, which causes the GC to binary stage 530 to convert the Gray code Q_GC<12:0> 522 latched in signal latch stage 528 to binary, which is coupled to be received at the first input "A" of the adder stage 536. At the same time, the reset or zero value latched in the feedback latch stage 532 is received at the second input "B" of the adder stage 536. The adder operation signal FA_OP 560 is set to a constant value of 0 throughout the CDS operation as shown in FIG. 5B. In the depicted example, ALU 518 is configured to perform addition when the adder operation signal FA_OP 560 is set to 1, while ALU 518 is configured to perform subtraction (or add a negative number to another number) when the adder operation signal FA_OP 560 is set to 0. As such, the adder stage 536 is configured to determine the sum of BLK and (−0), or BLK−0, which is latched into the pre-latch stage 538.

At time T4, the BLK−0 value that is latched in the pre-latch stage 538 is latched into feedback latch stage 532 in response to the feedback latch enable signal LAT_FB_EN 556.

Next, the comparator output signal CMPOUT 550 pulses at time T5 as the ramp signal 514 ramps down again during the signal level sampling, which causes the front end latch stage 526 to latch the signal level sample value SIG as represented Gray code signal Q_GC<12:0> 522.

At time T6, the signal latch enable signal LAT_SIG_EN 554 and pre-latch enable signal LAT_PRE_EN 562 are pulsed again, which causes the GC to binary stage 530 to convert the Gray code Q_GC<12:0> 522 latched in signal latch stage 528 to binary, which is coupled to be received at the first input "A" of the adder stage 536. At the same time, the BLK value latched in the feedback latch stage 532 is received at the second input "B" of the adder stage 536. The adder operation signal FA_OP 560 is set to 0, which causes the adder stage 536 to determine the sum of SIG and (−BLK), or SIG−BLK, which the CDS data that is latched into the pre-latch stage 538.

Next at time T7, the data latch enable signal LAT_DAT_EN 564 is pulsed, which causes the CDS data (SIG−BLK) to be latched into data latch stage 540, which may then be output to the global read bitline through transmission gate 542-$n$.

FIGS. 6A-6C illustrate one example of timing and signal flow during an example correlated multiple sampling (CMS) operation performed with an example arithmetic logic unit 618 in accordance with the teachings of the present invention. It is appreciated that FIG. 6A illustrates one bit of an ALU 618, which is substantially similar to ALU 518 of FIG. 5A or one example of one of the bits of ALU 418 as shown in FIG. 4. Accordingly, similarly named and numbered elements described above are coupled and function similarly below.

For instance, as shown in FIG. 6A, ALU 618 includes a front end latch stage 626 coupled to receive and latch a Gray code bit Q_GC 622-$n$ signal value in response to comparator output 650. ALU 618 also includes a pulse generator 644 that is coupled to receive the comparator output 650 from the respective comparator (e.g., comparator 216) of the column. In one example, the pulse generator 644 is coupled to generate a front end latch enable signal LAT_FE_EN 652 in response to the arrival of a falling edge in the comparator output CMPOUT 650. In one example, ALU 618 also includes a bypass switch 648 coupled between the input and output of pulse generator 644.

In the depicted example, ALU 618 also includes a signal latch stage 628 coupled to the output of the front end latch stage 626. In operation, the signal latch stage 628 is coupled to latch outputs of the front end latch stage 626 in response to a signal latch enable signal LAT_SIG_EN 654. ALU 618 also includes a GC to binary stage 630 that is coupled to generate binary representations of the Gray code bit Q_GC 622 signal value latched in the front end latch stage 626.

In the example, the ALU 618 also includes an adder stage 636, which includes a full adder 636-$n$ having a first input "A" coupled to an output of the GC to binary stage 630, a second input "B" coupled to an output of a multiplexer stage 634. In operation, output "S" of the adder stage is generated in response to the first input "A" and the second input "B" of the adder stage 636, which in the example is the sum of the values received at the first inputs "A" and the values received at second inputs "B."

In the depicted example, ALU 618 also includes a pre-latch stage 638 coupled to latch output of the adder stage 636 in response to a pre-latch enable signal LAT_PRE_EN 662. The ALU 618 also includes a feedback latch stage 632 coupled to latch the output of the pre-latch stage 638 in response to a feedback latch enable signal LAT_FB_EN 656. In the various examples, the feedback latch stage 632 can be reset (e.g., zeroed) in response to the feedback latch reset signal LAT_FB_RST 658. As shown in the example, the outputs of the feedback latch stage 632 include a first output "Q" and a second output "Qb." The first output "Q" of the feedback latch stage 632 is the latched output of the pre-latch stage 638. The second output "Qb" of the feedback latch stage 632 is an inverted latched output of the pre-latch stage 638.

In the example, ALU 618 also includes the multiplexer stage 634 coupled between the feedback latch stage 632 and the adder stage 636. In operation, the multiplexer stage 634 is configured to select either the first output "Q" or the second output "Qb" of the feedback latch stage 632 to be coupled to the second input "B" of the adder stage 636 in response to an adder operation signal FA_OP 660. Therefore, it is appreciated that the feedback latch stage 632 is configured to feed back the "S" output of the adder stage 636 back into the second input "B" of the adder stage 636 through pre-latch stage 638. In so doing, the sums generated by the adder stage 636 can be accumulated in the pre-latch stage 638 and then transferred to the feedback latch stage 632 over multiple summing operations of adder stage 636 between resets of the feedback latch stage 632 in accordance with the teachings of the present invention.

As discussed above, it is appreciated that the adder stage 636 is configured to perform addition by adding a feedback value latched in the feedback latch stage 632 and the binary representation of the GC outputs latched in the signal latch stage 628 through GC to binary stage 630 when the multiplexer stage 634 is configured to couple the first outputs "Q" of the feedback latch stage 632 to the second inputs "B" of the adder stage 636. Similarly, the adder stage 636 is configured to perform subtraction by adding the two's complement representation of a feedback value latched in the feedback latch stage 632 and the binary representation of the GC outputs latched in the signal latch stage 628 through the GC to binary stage 630 when the multiplexer stage 634 is configured to couple the second outputs "Qb" of the feedback latch stage 632 to the second inputs "B" of the adder stage 636.

Continuing with the illustrated example, ALU 618 also includes a data latch stage 640 coupled between the pre-latch stage 638 and an ALU output of the ALU 618. In operation, the data latch stage 640 is coupled to latch the output of the pre-latch stage 638 in response to a data latch enable signal LAT_DAT_EN 664. In addition, ALU 618 also includes a transmission gate 642-$n$ coupled between the respective "Q" output of the data latch stage 640 and the ALU output. In one example, the ALU output is coupled to a global read bitline.

As shown in the example depicted in FIG. 6B, ramp signal 614 includes a plurality of black level sample events (e.g., BLK1 and BLK2) and a plurality of signal level sample events (e.g., SIG1 and SIG2). As such, a correlated multiple sampling (CMS) operation is performed such that the difference between the accumulated sum of signal level samples and the accumulated sum of black level samples ((SIG1+SIG2)−(BLK1+BLK2)) is determined by ALU 618.

The example depicted in FIG. 6B shows that processing begins with the feedback latch reset signal LAT_FB_RST 658 being pulsed to reset the feedback latch stage 632 and zero out any previous data latched in the feedback latch stage 632. Next the comparator output signal CMPOUT 650 pulses as the ramp signal 614 ramps down, which causes the front end latch stage 626 to latch the first black level sample value BLK1 as represented Gray code signal Q_GC<12:0> 622.

Next, the signal latch enable signal LAT_SIG_EN 654 and pre-latch enable signal LAT_PRE_EN 662 are pulsed, which causes the GC to binary stage 630 to convert the Gray code Q_GC<12:0> 622 latched in signal latch stage 628 to binary, which is coupled to be received at the first input "A" of the adder stage 636. At the same time, the reset or zero value latched in the feedback latch stage 632 is received at the second input "B" of the adder stage 636. The adder operation signal FA_OP 660 is set to 1. The ALU 618 is configured to perform addition when the adder operation signal FA_OP 660 is set to 1, while ALU 618 is configured to perform subtraction (or add a negative number to another number) when the adder operation signal FA_OP 660 is set to 0. As such, the adder stage 636 is configured to determine the sum of BLK1 and 0, or BLK1+0, which is latched into the pre-latch stage 638.

Next, the BLK1+0 value that is latched in the pre-latch stage 638 is latched into feedback latch stage 632 in response to the feedback latch enable signal LAT_FB_EN 656.

Next the comparator output signal CMPOUT 650 pulses a second time as the ramp signal 614 ramps down, which causes the front end latch stage 626 to latch the second black level sample value BLK2 as represented Gray code signal Q_GC<12:0> 622.

Next, at time T1 in FIG. 6B, the signal latch enable signal LAT_SIG_EN 654 and pre-latch enable signal LAT_PRE_EN 662 are pulsed, which causes the GC to binary stage 630 to convert the Gray code Q_GC<12:0> 622 latched in signal latch stage 628 to binary, which is coupled to be received at the first input "A" of the adder stage 636. At the same time, the BLK1 value latched in the feedback latch stage 632 is received at the second input "B" of the adder stage 636. The adder operation signal FA_OP 660 is set to 1, which causes the adder stage 636 determine the sum of BLK1 and BLK2 (e.g., BLK1+BLK2), which is latched into the pre-latch stage 638.

Next, at time T2, the accumulated sum (e.g., BLK1+BLK2) that is latched in the pre-latch stage 638 is latched into feedback latch stage 632 in response to the feedback latch enable signal LAT_FB_EN 656. It is noted that the illustrated example describes two black level values, BLK1 and BLK2, being sampled. It is appreciated that the example above can be repeated as many times as desired to accumulate the sum of one or more samples in the pre-latch stage 638 and feedback latch stage 632 in accordance with the teachings of the present invention. As noted, with more black and/or signal level samples, improved signal to noise ratio (SNR) performance can be achieved, but with a lower frame rate. Examples in accordance with the teachings of the present invention can support different numbers of black level and/or signal level samples in order to find a sweet spot for noise and speed.

Next, at time T3, the comparator output signal CMPOUT 650 pulses a third time as the ramp signal 614 ramps down, which causes the front end latch stage 626 to latch the first signal level sample value SIG1 as represented Gray code signal Q_GC<12:0> 622.

Next, at time T4 in FIG. 6B, the signal latch enable signal LAT_SIG_EN 654 and pre-latch enable signal LAT_PRE_EN 662 are pulsed, which causes the GC to binary stage 630 to convert the Gray code Q_GC<12:0> 622 latched in signal latch stage 628 to binary, which is coupled to be received at the first input "A" of the adder stage 636. At the same time, the accumulated sum of black signal level value samples, BLK1+BLK2, is latched in the feedback latch stage 632. At this time, it is noted that the adder operation signal FA_OP 660 is set to 0, which causes the second input "B" of the adder stage 636 to receive the "Qb" inverted output of the feedback latch stage 632. In addition, the adder operation signal FA_OP 660 being set to 0 at this time causes the carry-in input "CI" of the LSB of the adder stage 636 to receive a 1 as described above. As such, the full adder 636 is configured to determine the sum of the first signal level sample SIG1 and the two's complement of the accumulated sum of black signal level value samples, BLK1+BLK2. In other words, the adder stage 636 is caused to determine the sum of SIG1+(−(BLK1+BLK2)), which is equal to SIG1−(BLK1+BLK2), which is latched into the pre-latch stage 638.

Next, at time T5, the sum that is latched in the pre-latch stage 638 is latched into feedback latch stage 632 in response to the feedback latch enable signal LAT_FB_EN 656.

Next, at time T6, the comparator output signal CMPOUT 650 pulses a fourth time as the ramp signal 614 ramps down, which causes the front end latch stage 626 to latch the second signal level sample value SIG2 as represented Gray code signal Q_GC<12:0> 622.

Next, at time T7 in FIG. 6B, the signal latch enable signal LAT_SIG_EN 654 and pre-latch enable signal LAT_PRE_EN 662 are pulsed, which causes the GC to binary stage 630 to convert the Gray code Q_GC<12:0> 622 latched in signal latch stage 628 to binary, which is coupled to be received at the first input "A" of the adder stage 636. At this time, it is noted that the adder operation signal FA_OP 660 is set back to 1, which causes the second input "B" of the adder stage 636 to receive the "Q" output of the feedback latch stage 632. Thus, at this time, the SIG1−(BLK1+BLK2) value that is latched in the feedback latch stage 632 is received at the second input "B" of the adder stage 636. With the adder operation signal FA_OP 660 set to 1, the adder stage is configured to determine the sum of SIG2 and SIG1−(BLK1+BLK2), which is equal to (SIG1+SIG2)−(BLK1+BLK2), which is the CMS data that is then latched into the pre-latch stage 638.

Next at time T8, the data latch enable signal LAT_DAT_EN 664 is pulsed, which causes the CMS data ((SIG1+SIG2)−(BLK1+BLK2)) to be latched into data latch stage 640, which may then be output to the global read bitline through transmission gate 642-n.

FIGS. 7A-7C illustrate another example of timing and signal flow during another example of correlated multiple sampling (CMS) operation performed with an example arithmetic logic unit 718 in accordance with the teachings of the present invention. It is appreciated that FIG. 7A illustrates one bit of an ALU 718, which is substantially similar to ALU 618 of FIG. 6A, ALU 518 of FIG. 5A, or one example of one of the bits of ALU 418 as shown in FIG. 4. Accordingly, similarly named and numbered elements described above are coupled and function similarly below.

For instance, as shown in FIG. 7A, ALU 718 includes a front end latch stage 726 coupled to receive and latch a Gray code bit Q_GC 722-n signal value in response to comparator output 750. ALU 718 also includes a pulse generator 744 that is coupled to receive the comparator output 750 from the respective comparator (e.g., comparator 216) of the column. In one example, the pulse generator 744 is coupled to generate a front end latch enable signal LAT_FE_EN 752 in response to the arrival of a falling edge in the comparator output CMPOUT 750. In one example, ALU 718 also includes a bypass switch 748 coupled between the input and output of pulse generator 744.

In the depicted example, ALU 718 also includes a signal latch stage 728 coupled to the output of the front end latch stage 726. In operation, the signal latch stage 728 is coupled to latch outputs of the front end latch stage 726 in response to a signal latch enable signal LAT_SIG_EN 754. ALU 718 also includes a GC to binary stage 730 that is coupled to generate binary representations of the Gray code bit Q_GC 722 signal value latched in the front end latch stage 726.

In the example, the ALU 718 also includes an adder stage 736, which includes a full adder 736-n having a first input "A" coupled to an output of the GC to binary stage 730, a second input "B" coupled to an output of a multiplexer stage 734. In operation, output "S" of the adder stage is generated in response to the first input "A" and the second input "B" of the adder stage 736, which in the example is the sum of the values received at the first inputs "A" and the values received at second inputs "B."

In the depicted example, ALU 718 also includes a pre-latch stage 738 coupled to latch output of the adder stage 736 in response to a pre-latch enable signal LAT_PRE_EN 772. The ALU 718 also includes a feedback latch stage 732 coupled to latch the output of the pre-latch stage 738 in response to a feedback latch enable signal LAT_FB_EN 756. In the various examples, the feedback latch stage 732 can be reset (e.g., zeroed) in response to the feedback latch reset signal LAT_FB_RST 758. As shown in the example, the outputs of the feedback latch stage 732 include a first output "Q" and a second output "Qb." The first output "Q" of the feedback latch stage 732 is the latched output of the pre-latch stage 738. The second output "Qb" of the feedback latch stage 732 is an inverted latched output of the pre-latch stage 738.

In the example, ALU 718 also includes the multiplexer stage 734 coupled between the feedback latch stage 732 and the adder stage 736. In operation, the multiplexer stage 734 is configured to select either the first output "Q" or the second output "Qb" of the feedback latch stage 732 to be coupled to the second input "B" of the adder stage 736 in response to an adder operation signal FA_OP 770. Therefore, it is appreciated that the feedback latch stage 732 is configured to feed back the "S" output of the adder stage 736 back into the second input "B" of the adder stage 736 through pre-latch stage 738. In so doing, the sums generated by the adder stage 736 can be accumulated in the pre-latch stage 738 and then transferred to the feedback latch stage 732 over multiple summing operations of adder stage 736 between resets of the feedback latch stage 732 in accordance with the teachings of the present invention.

As discussed above, it is appreciated that the adder stage 736 is configured to perform addition by adding a feedback value latched in the feedback latch stage 732 and the binary representation of the GC outputs latched in the signal latch stage 728 through GC to binary stage 730 when the multiplexer stage 734 is configured to couple the first outputs "Q" of the feedback latch stage 732 to the second inputs "B" of the adder stage 736. Similarly, the adder stage 736 is configured to perform subtraction by adding the two's complement representation of a feedback value latched in the feedback latch stage 732 and the binary representation of the GC outputs latched in the signal latch stage 728 through the GC to binary stage 730 when the multiplexer stage 734 is configured to couple the second outputs "Qb" of the feedback latch stage 732 to the second inputs "B" of the adder stage 736.

Continuing with the illustrated example, ALU 718 also includes a data latch stage 740 coupled between the pre-latch stage 738 and an ALU output of the ALU 718. In operation, the data latch stage 740 is coupled to latch the output of the pre-latch stage 738 in response to a data latch enable signal LAT_DAT_EN 764. In addition, ALU 718 also includes a transmission gate 742-n coupled between the respective "Q" output of the data latch stage 740 and the ALU output. In one example, the ALU output is coupled to a global read bitline.

As shown in the example depicted in FIG. 7B, ramp signal 714 includes a plurality of black level sample events (e.g., BLK1 and BLK2) and one signal level sample event (e.g., SIG1). Thus, it is appreciated that there is an unequal number of black level and signal level sample events in the depicted example. However, a correlated multiple sampling (CMS) operation can still be performed by ALU 718 be using the same signal level sample SIG1 multiple times such that the effective total number of black level sample events matches the total effective number of signal level sample events when generating the CMS output in accordance with the teachings of the present invention. As such, in the depicted example, the CMS output determined by ALU 718 is equal to ((SIG1+SIG1)−(BLK1+BLK2)), which is equal to ((2*SIG1)−(BLK1+BLK2)).

To illustrate, it is appreciated that processing in FIG. 7B begins similarly to processing in FIG. 6B. For instance, the example depicted in FIG. 7B shows that processing begins with the feedback latch reset signal LAT_FB_RST 758 being pulsed to reset the feedback latch stage 732 and zero out any previous data latched in the feedback latch stage 732. Next the comparator output signal CMPOUT 750 pulses as the ramp signal 714 ramps down, which causes the front end latch stage 726 to latch the first black level sample value BLK1 as represented Gray code signal Q_GC<12:0> 722.

Next, the signal latch enable signal LAT_SIG_EN 754 and pre-latch enable signal LAT_PRE_EN 772 are pulsed, which causes the GC to binary stage 730 to convert the Gray code Q_GC<12:0> 722 latched in signal latch stage 728 to binary, which is coupled to be received at the first input "A" of the adder stage 736. At the same time, the reset or zero value latched in the feedback latch stage 732 is received at the second input "B" of the adder stage 736. The adder operation signal FA_OP 770 is set to 1. The ALU 718 is configured to perform addition when the adder operation signal FA_OP 770 is set to 1, while ALU 718 is configured to perform subtraction (or add a negative number to another number) when the adder operation signal FA_OP 770 is set to 0. As such, the adder stage 736 is configured to determine the sum of BLK1 and 0, or BLK1+0, which is latched into the pre-latch stage 738.

Next, the BLK1+0 value that is latched in the pre-latch stage 738 is latched into feedback latch stage 732 in response to the feedback latch enable signal LAT_FB_EN 756.

Next the comparator output signal CMPOUT 750 pulses a second time as the ramp signal 714 ramps down, which causes the front end latch stage 726 to latch the second black level sample value BLK2 as represented Gray code signal Q_GC<12:0> 722.

Next, the signal latch enable signal LAT_SIG_EN 754 and pre-latch enable signal LAT_PRE_EN 772 are pulsed again, which causes the GC to binary stage 730 to convert the Gray code Q_GC<12:0> 722 latched in signal latch stage 728 to binary, which is coupled to be received at the first input "A" of the adder stage 736. At the same time, the BLK1 value latched in the feedback latch stage 732 is received at the second input "B" of the adder stage 736. The adder operation signal FA_OP 770 is set to 1, which causes the adder stage 736 determine the sum of BLK1 and BLK2 (e.g., BLK1+BLK2), which is latched into the pre-latch stage 738. Next, the accumulated sum (e.g., BLK1+BLK2) that is latched in the pre-latch stage 738 is latched into feedback latch stage 732 in response to the feedback latch enable signal LAT_FB_EN 756.

Next, the comparator output signal CMPOUT 750 pulses a third time as the ramp signal 714 ramps down, which causes the front end latch stage 726 to latch the signal level sample value SIG1 as represented Gray code signal Q_GC<12:0> 722.

Next, the signal latch enable signal LAT_SIG_EN 754 and pre-latch enable signal LAT_PRE_EN 772 are pulsed again, which causes the GC to binary stage 730 to convert the Gray code Q_GC<12:0> 722 latched in signal latch stage 728 to binary, which is coupled to be received at the first input "A" of the adder stage 736. At the same time, the accumulated sum of black signal level value samples, BLK1+BLK2, is latched in the feedback latch stage 732. At this time, it is noted that the adder operation signal FA_OP 770 is set to 0, which causes the second input "B" of the adder stage 736 to receive the "Qb" inverted output of the feedback latch stage 732. In addition, the adder operation signal FA_OP 770 being set to 0 at this time causes the carry-in input "CI" of the LSB of the adder stage 736 to receive a 1 as described above. As such, the full adder 736 is configured to determine the sum of the signal level sample SIG1 and the two's complement of the accumulated sum of black signal level value samples, BLK1+BLK2. In other words, the adder stage 736 is caused to determine the sum of SIG1+(−(BLK1+BLK2)), which is equal to SIG1−(BLK1+BLK2), which is latched into the pre-latch stage 738.

As mentioned, in the example described in FIG. 7B, only one signal level sample SIG1 is sampled. Therefore, in the depicted example, the one signal level sample SIG1 is added again to the accumulated sum to determine the CMS output since two black level signals BLK1 and BLK2 were sampled. Thus, at time T1 in FIG. 7B, the sum that is latched in the pre-latch stage 738 is latched back into the feedback latch stage 732 in response to the feedback latch enable signal LAT_FB_EN 756. At this time, the adder operation signal FA_OP 770 is set to 1, which causes the ALU 718 to perform addition. Thus, at this time, the binary representation of the signal level sample SIG1, which is still latched in signal latch stage 728, is received at the first input "A" of the adder stage 736. At the same time, the (SIG1−(BLK1+BLK2)) value latched in the feedback latch stage 732 is received at the second input "B" of the adder stage 736. with the adder operation signal FA_OP 770 is set to 1, the adder stage 736 determines the sum of SIG1 and (SIG1−(BLK1+BLK2)), which is equal to (2*SIG1)−(BLK1+BLK2).

Next, at time T2 in FIG. 7B, the pre-latch enable signal LAT_PRE_EN 762 is pulsed again, which causes the adder stage 736 output ((2*SIG1)−(BLK1+BLK2)), which is the CMS data, to be latched into the pre-latch stage 738.

Next at time T3 in FIG. 7B, the data latch enable signal LAT_DAT_EN 764 is pulsed, which causes the CMS data ((2*SIG1)−(BLK1+BLK2)) to be latched into data latch stage 740, which may then be output to the global read bitline through transmission gate 742-n.

Figure 8A:
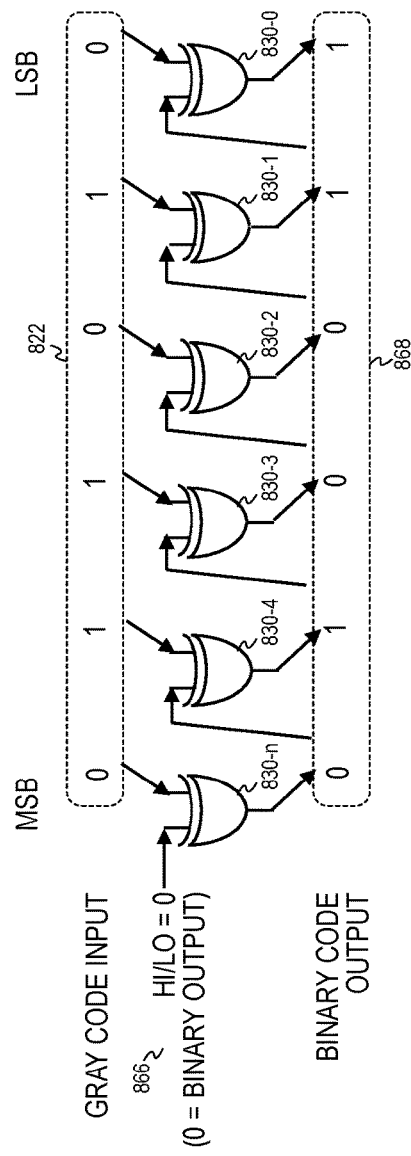
FIGS. 8A-8B are schematics that illustrate one example of a Gray code to binary/inverted binary stage in accordance with the teachings of the present invention.
Figure 8B:
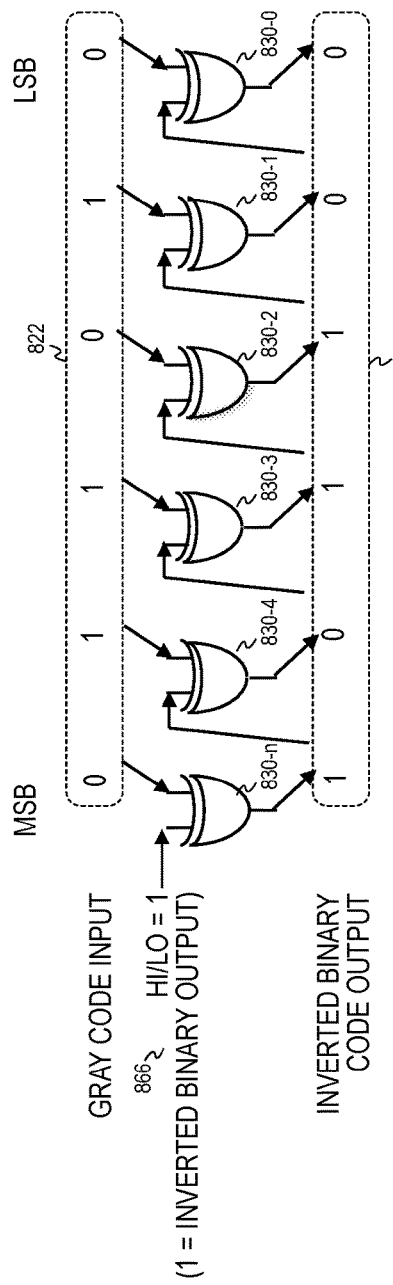

FIGS. 8A-8B are schematics that illustrate one example of a Gray code (GC) to binary/inverted binary stage 830 in accordance with the teachings of the present invention. In the depicted example, it is noted that the GC to binary/inverted binary stage 830 is coupled to receive an N bit Gray code input 822 from a GC generator (e.g., GC generator 220). Thus, in the illustrated example, the GC to binary/inverted binary circuit 830 includes N exclusive-OR (XOR) gates 830-0 to 830-n, as illustrated in FIGS. 8A-8B. In the example, first inputs of the XOR gates 830-0 to 830-n are coupled to receive the respective bits of the GC outputs of the GC generator as shown. In the depicted example, it is noted that XOR gate 830-0 is coupled to receive the least significant bit (LSB) of the N bit Gray code input 822 and that XOR gate 830-n is coupled to receive the most significant bit (MSB) of the N bit Gray code input 822.

Continuing with the example depicted in FIGS. 8A-8B, second inputs of the N−1 XOR gates corresponding to least N−1 significant bits of the N bit Gray code input 822 are coupled to receive respective outputs 868 of nearest neighboring XOR gates corresponding to a higher bit value of the N bit Gray code input 822 as shown. In other words, the N−1 XOR gates of the least N−1 significant bits (e.g., the N−1 XOR gates towards the right side of FIGS. 8A-8B) are coupled to receive outputs 868 of the neighboring XOR gate to the left as shown in FIGS. 8A-8B. The second input of an Nth XOR gate corresponding to the MSB of the N bit Gray code input 822 is coupled to receive a Hi/Lo 866 value as shown.

As shown in the example, depicted in FIG. 8A, when the Hi/Lo 866 value is set to 0 (e.g., low value), the outputs 868 of the N XOR gates 830-0 to 830-*n* of the GC to binary/inverted binary circuit 830 are configured to generate the binary representations of the N bit Gray code input 822 in accordance with the teachings of the present invention. However, when the Hi/Lo 866 value is set to 1 (e.g., high value), the outputs 868 of the N XOR gates 830-0 to 830-*n* of the GC to binary/inverted binary circuit 830 are configured to generate inverted binary representations of the N bit Gray code input 822 in accordance with the teachings of the present invention.

Figure 9:
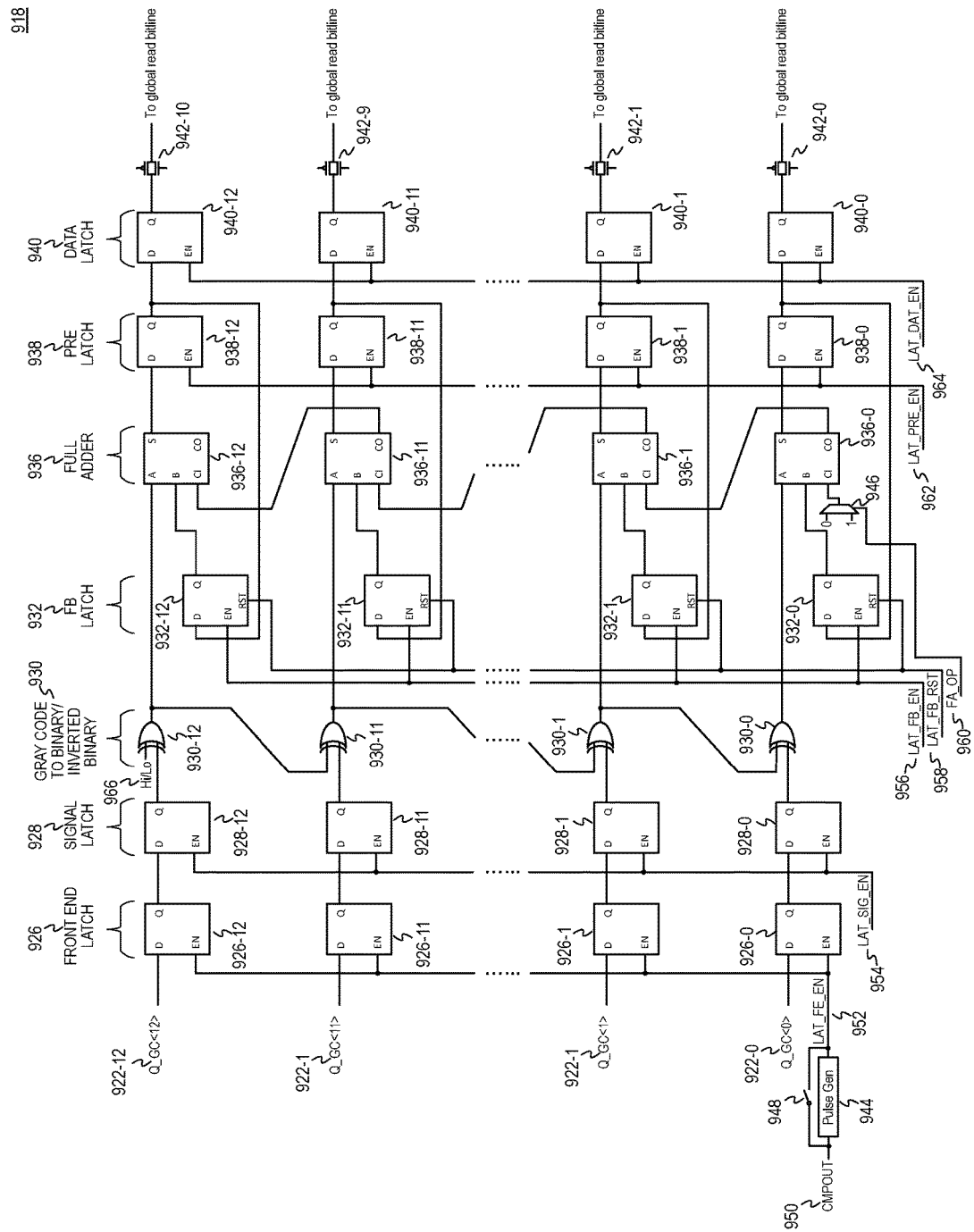
FIG. 9 is a schematic that illustrates another example of one of a plurality of arithmetic logic units including one example of a Gray code to binary/inverted binary stage in accordance with the teachings of the present invention.

FIG. 9 is a schematic that illustrates another example of one of a plurality of arithmetic logic units 918 including one example of a Gray code to binary/inverted binary stage 930 in accordance with the teachings of the present invention. It is appreciated the ALU 918 of FIG. 9 may be another example of one of the plurality of column ALUs 218 as shown in FIG. 2, and that ALU 918 of FIG. 9 shares similarities with ALU 418 of FIG. 4. Accordingly, similarly named and numbered elements described above are coupled and function similarly below.

For instance, as shown in the example depicted in FIG. 9, ALU 918 is coupled to sample and hold or latch the received 13-bit Gray code Q_GC<12:0> 922 in response to a comparator output COMPOUT 950. In one example, each ALU 918 is coupled to latch the 13-bit Gray code Q_GC<12:0> 922 in response to the arrival of a falling edge of comparator output COMPOUT 950 to complete the analog to digital conversion by converting the latched 13-bit Gray code Q_GC<12:0> 922 to a binary value.

In various examples, the plurality of ALUs 918 are also further coupled to perform correlated double sampling (CDS) or correlated multiple sampling (CMS) in parallel by determining a difference between an accumulated sum of one or more signal level samples and an accumulated sum of one or more black level samples of the image data that are read out from each of a plurality of pixel circuits 104 of the pixel array 102 to generate a normalized digital or binary output value for the image data received from the image sensor.

As shown in the example depicted in FIG. 9, ALU 918 includes a front end latch stage 926 coupled to receive and latch Gray code Q_GC<12:0> 922 signal values in response to comparator output 950. In the illustrated example, front end latch stage 926 includes a plurality of latches 926-0 to 926-12, each of which has a data input "D" coupled to receive a respective bit of Gray code Q_GC<12:0> 922.

In the example, ALU 918 also includes a pulse generator 944 that is coupled to receive the comparator output 950 from the respective comparator (e.g., comparator 216) of the column. In one example, the pulse generator 944 is coupled to generate a front end latch enable signal LAT_FE_EN 952 in response to the arrival of a falling edge in the comparator output CMPOUT 950. In one example, the pulse of front end latch enable signal LAT_FE_EN 952 is coupled to an enable input of each one of the plurality of latches 926-0 to 926-12 of front end latch stage 926. In one example, ALU 918 also includes a bypass switch 948 coupled between the input and output of pulse generator 944 of FIG. 9 to implement a bypass mode. In operation, when bypass switch 948 is closed, the bypass mode is enabled. When the bypass mode is enabled, the front end latch enable signal LAT_FE_EN 952 is substantially the same or substantially equal to the comparator output COMPOUT 950. When the bypass switch 948 is opened, the bypass mode is disabled. When the bypass mode is disabled, the front end latch enable signal LAT_FE_EN 952 is substantially the same or substantially equal to the output pulse from the pulse generator 944.

In the depicted example, ALU 918 also includes a signal latch stage 928 coupled to the output of the front end latch stage 926. In operation, the signal latch stage 928 is coupled to latch outputs of the front end latch stage 926 in response to a signal latch enable signal LAT_SIG_EN 954. In the depicted example, the signal latch stage 928 includes a plurality of latches 928-0 to 928-12. Each one of the plurality of latches 928-0 to 928-12 has a data input "D" coupled to the "Q" output of a respective one of a plurality of latches 926-0 to 926-12 of the front end latch stage 926. Each one of the plurality of latches 928-0 to 928-12 has an enable input "EN" coupled to receive the signal latch enable signal LAT_SIG_EN 954.

The example in FIG. 9 shows that ALU 918 also includes a GC to binary/inverted binary stage 930 that is coupled to generate binary representations or inverted binary representations of the Gray code Q_GC<12:0> 922 signal values latched in the front end latch stage 926 in response to a Hi/Lo signal 966. It is appreciated that the GC to binary/inverted binary stage 930 shown in FIG. 9 may be an example of the GC to binary/inverted binary stage 830 shown in FIG. 8. For instance, as shown in the example illustrated in FIG. 9, GC to binary/inverted binary stage 930 includes a plurality of exclusive-OR (XOR) gates 930-0 to 930-12, each of which has an output coupled to generate the corresponding binary (or inverted binary) bit, and a first input coupled to receive a respective "Q" output of the plurality of latches 928-0 to 928-12 of signal latch stage 928. Assuming that the Gray code Q_GC<12:0> 922 signal values have N bits, where Gray code Q_GC<12> 922-12 is the most significant bit (MSB) and Gray code Q_GC<11:0> are the N−1 least significant bits (LSBs), each one of the plurality of XOR gates 930-0 to 930-11 that correspond to the N−1 LSBs has a second input coupled to receive respective outputs of nearest neighboring XOR gates of GC to binary/inverted binary stage 930 corresponding to a higher bit value as shown. In the example depicted in FIG. 9, the second input of the XOR gate 930-12, which corresponds to the MSB, is coupled to receive the Hi/Lo signal 966.

As described above, when the Hi/Lo 966 value is set to 0 (e.g., low value), the outputs of the N XOR gates 930-0 to 930-12 of the GC to binary/inverted binary circuit 930 are configured to generate the binary representations of the N bit Gray code Q_GC<12:0> 922 latched in the signal latch stage 928 in accordance with the teachings of the present invention. However, when the Hi/Lo 966 value is set to 1 (e.g., high value), the outputs of the N XOR gates 930-0 to 930-12 of the GC to binary/inverted binary circuit 930 are configured to generate the inverted binary representations of the N bit Gray code Q_GC<12:0> 922 latched in the signal latch stage 928 in accordance with the teachings of the present invention.

As shown in the depicted example depicted in FIG. 9, the ALU 918 also includes an adder stage 936, which includes a plurality of full adders 936-0 to 936-12, each of which having a first input "A" coupled to an output of the GC to binary/inverted binary stage 930, and a second input "B" coupled to the "Q" outputs of a feedback latch stage 932, which will be described in greater detail below. In operation, outputs "S" of the adder stage are generated in response to the first inputs "A" and the second inputs "B" of the adder stage 936, which in the example is the sum of the values received at the first inputs "A" and the values received at second inputs "B."

The example in FIG. 9 shows that ALU 918 also includes a pre-latch stage 938 coupled to latch outputs of the adder stage 936 in response to a pre-latch enable signal LAT_PRE_EN 962. In the depicted example, the pre-latch stage 938 includes a plurality of latches 938-0 to 938-12. Each one of the plurality of latches 938-0 to 938-12 has a data input "D" coupled to the "S" output of a respective one of the plurality of full adders 936-0 to 936-12 of the adder stage 936. Each one of the plurality of latches 938-0 to 938-12 has an enable input "EN" coupled to receive the pre-latch enable signal LAT_PRE_EN 962.

The example in FIG. 9 shows that ALU 918 also includes the feedback latch stage 932 coupled to latch outputs of the pre-latch stage 938 in response to a feedback latch enable signal LAT_FB_EN 956. Thus, similar to the ALU 418 of FIG. 4, it is further appreciated that the feedback latch stage 932 of FIG. 9 is also configured to feed back the "S" outputs of the adder stage 936 back into the second input "B" of the adder stage 936 through the pre-latch stage 938. In so doing, the sums generated by the adder stage 936 can be accumulated in the pre-latch stage 938 and then transferred to the feedback latch stage 932 over multiple summing operations of adder stage 936 between resets of the feedback latch stage 932 in accordance with the teachings of the present invention.

As shown the depicted example, the feedback latch stage 932 includes a plurality of latches 932-0 to 932-12. Each one of the plurality of latches 932-0 to 932-12 of the feedback stage 932 has a data input "D" coupled to the "Q" output of a respective one of the plurality of latches 938-0 to 938-12 of the pre-latch stage 938. Each one of the plurality of latches 932-0 to 932-12 has an enable input "EN" coupled to receive the feedback latch enable signal LAT_FB_EN 956 and a reset input coupled to receive a feedback latch reset signal LAT_FB_RST 958. In the various examples, the feedback latch stage 932 can be reset (e.g., zeroed) in response to the feedback latch reset signal LAT_FB_RST 958.

One difference between ALU 918 of FIG. 9 and ALU 418 of FIG. 4 is that ALU 918 of FIG. 9 does not include a multiplexer stage coupled between the feedback latch stage 932 and the adder stage 936. As such, the "Q" outputs of the feedback latch stage 932 are coupled to the second inputs "B" of the adder stage 936 without having to be selected by an intervening multiplexer stage. Stated in another way, since the outputs of the GC to binary/inverted binary stage 930 can be inverted, the adder stage 936 no longer needs to receive an inverted "Qb" output from the feedback latch stage 932 in order to perform subtraction.

To that end, as shown in the depicted example, the LSB of the adder stage 936 is full adder 936-0. In the example, the carry-in "CI" input of full adder 936-0 is coupled to an output of a multiplexer 946. In operation, the multiplexer 946 is configured to select either a low value or a high value (e.g., "0" or "1") to be coupled to be received by the carry-in "CI" input of full adder 936-0 in response to the adder operation signal FA_OP 960 depending on whether addition or subtraction is to be performed.

Thus, in operation, the carry-in "CI" input of full adder 936-0 is coupled to receive a low value (e.g., "0") from multiplexer 946 when the Hi/Lo 966 value is set to 0, which causes the GC to binary/inverted binary circuit 930 to generate the binary representations of the N bit Gray code Q_GC<12:0> 922 latched in the signal latch stage 928. Similarly, the carry-in "CI" input of full adder 936-0 is coupled to receive a high value (e.g., "1") from multiplexer 946 when the Hi/Lo 966 value is set to 1, which causes the GC to binary/inverted binary circuit 930 to generate the inverted binary representations of the N bit Gray code Q_GC<12:0> 922 latched in the signal latch stage 928.

Accordingly, it is appreciated that the adder stage 936 is configured to add a feedback value latched in the feedback latch stage 932 and the binary representation of the GC outputs latched in the signal latch stage 928 through GC to binary/inverted binary stage 930 when the carry-in "CI" input of full adder 936-0 is coupled to receive a low value (e.g., "0") from multiplexer 946. Similarly, the adder stage 936 is configured to add a two's complement representation of the N bit Gray code Q_GC<12:0> 922 latched in the signal latch stage 928 and the feedback value latched in the feedback latch stage 932 when the carry-in "CI" input of full adder 936-0 is coupled to receive a high value (e.g., "1") from multiplexer 946. It is appreciated of course that the two's complement representation of the GC outputs latched in the signal latch stage 928 is the inverted binary representation (e.g, the inverted "Qb" output) plus one, which can be realized by setting the carry-in "CI" input of full adder 936-0 to receive a high value (e.g., "1") from multiplexer 946. As a result, the adder stage 936 can perform subtraction by adding a negative representation of a number (e.g., the two's complement representation) to another number.

Continuing with the illustrated example, ALU 918 also includes a data latch stage 940 coupled between the pre-latch stage 938 and an ALU output of the ALU 918. In operation, the data latch stage 940 is coupled to latch the output of the pre-latch stage 938 in response to a data latch enable signal LAT_DAT_EN 964. In the illustrated example, data latch stage 940 includes a plurality of latches 940-0 to 962-12, each of which has a data input "D" coupled to receive a respective output "Q" from pre-latch stage 938. In addition, each of the plurality of latches 940-0 to 940-12 includes an enable input "EN" coupled to receive the data latch enable signal LAT_DAT_EN 964.

In the depicted example, a plurality of transmission gates 942-0 to 942-12 are coupled between the respective "Q" outputs of the plurality of latches 940-0 to 940-12 and the ALU output. In one example, the ALU output is coupled to a global read bitline. In one example, the ALU output is coupled to a global read bitline via a shift register readout, such as for example as illustrated and described in FIG. 2 above.

FIGS. 10A-10C illustrate one example of timing and signal flow during an example correlated multiple sampling (CMS) operation performed with an example arithmetic logic unit 1018 including one example of a Gray code to binary/inverted binary stage 1030 in accordance with the teachings of the present invention.

For instance, as shown in FIG. 10A, ALU 1018 includes a front end latch stage 1026 coupled to receive and latch a Gray code bit Q_GC 1022-n signal value in response to comparator output 1050. ALU 1018 also includes a pulse generator 1044 that is coupled to receive the comparator output 1050 from the respective comparator (e.g., comparator 216) of the column. In one example, the pulse generator 1044 is coupled to generate a front end latch enable signal LAT_FE_EN 1052 in response to the arrival of a falling edge in the comparator output CMPOUT 1050. In one example, ALU 1018 also includes a bypass switch 1048 coupled between the input and output of pulse generator 1044.

In the depicted example, ALU 1018 also includes a signal latch stage 1028 coupled to the output of the front end latch stage 1026. In operation, the signal latch stage 1028 is coupled to latch outputs of the front end latch stage 1026 in response to a signal latch enable signal LAT_SIG_EN 1054. ALU 1018 also includes a GC to binary/inverted binary stage 1030 that is coupled to generate binary representations or inverted binary of the Gray code bit Q_GC 1022 signal value latched in the front end latch stage 1026 in response to a Hi/Lo signal 1066.

In the example, the ALU 1018 also includes an adder stage 1036, which includes a full adder 1036-$n$ having a first input "A" coupled to an output of the GC to binary/inverted binary stage 1030, a second input "B" coupled to a "Q" output of a feedback latch stage 1032. In operation, output "S" of the adder stage is generated in response to the first input "A" and the second input "B" of the adder stage 1036, which in the example is the sum of the values received at the first inputs "A" and the values received at second inputs "B."

In the depicted example, ALU 1018 also includes a pre-latch stage 1038 coupled to latch output of the adder stage 1036 in response to a pre-latch enable signal LAT_PRE_EN 1062. The ALU 1018 also includes a feedback latch stage 1032 coupled to latch the output of the pre-latch stage 1038 in response to a feedback latch enable signal LAT_FB_EN 1056. In the various examples, the feedback latch stage 1032 can be reset (e.g., zeroed) in response to the feedback latch reset signal LAT_FB_RST 1058. As shown in the example, the output "Q" of the feedback latch stage 1032 is the latched output of the pre-latch stage 1038.

It is appreciated that the feedback latch stage 1032 is configured to feed back the "S" output of the adder stage 1036 back into the second input "B" of the adder stage 1036 through pre-latch stage 1038. In so doing, the sums generated by the adder stage 1036 can be accumulated in the pre-latch stage 1038 and then transferred to the feedback latch stage 1032 over multiple summing operations of adder stage 1036 between resets of the feedback latch stage 1032 in accordance with the teachings of the present invention.

As discussed above, the carry-in "CI" input of the LSB of the adder stage 1036 is coupled to receive a 0 (e.g., low) when the GC to binary/inverted binary stage 1030 is configured to generate a binary representation of the Gray code bit Q_GC 1022 signal value latched in the front end latch stage 1026 in response to a Hi/Lo signal 1066. In addition, the carry-in "CI" input of the LSB of the adder stage 1036 is coupled to receive a 1 (e.g., high) when the GC to binary/inverted binary stage 1030 is configured to generate an inverted binary representation of the Gray code bit Q_GC 1022 signal value latched in the front end latch stage 1026 in response to a Hi/Lo signal 1066.

Thus, it is appreciated that the adder stage 1036 is configured to perform addition by adding the binary representation of the Gray code bit Q_GC 1022 signal value latched in the front end latch stage 1026 and the feedback value latched in the feedback latch stage 1032 when the Hi/Lo signal 1066 is 0. Similarly, the adder stage 1036 is configured to perform subtraction by adding the two's complement of the binary representation of the Gray code bit Q_GC 1022 signal value latched in the front end latch stage 1026 and the feedback value latched in the feedback latch stage 1032 when the Hi/Lo signal 1066 is 1.

Continuing with the illustrated example, ALU 1018 also includes a data latch stage 1040 coupled between the pre-latch stage 1038 and an ALU output of the ALU 1018. In operation, the data latch stage 1040 is coupled to latch the output of the pre-latch stage 1038 in response to a data latch enable signal LAT_DAT_EN 1064. In addition, ALU 1018 also includes a transmission gate 1042-$n$ coupled between the respective "Q" output of the data latch stage 1040 and the ALU output. In one example, the ALU output is coupled to a global read bitline.

As shown in the example depicted in FIG. 10B, ramp signal 1014 includes a plurality of black level sample events (e.g., BLK1 and BLK2) and a plurality of signal level sample events (e.g., SIG1 and SIG2). As such, a correlated multiple sampling (CMS) operation is performed such that the difference between the accumulated sum of signal level samples and the accumulated sum of black level samples ((SIG1+SIG2)−(BLK1+BLK2)) is determined by ALU 1018. It is appreciated that the total of 2 black level samples and 2 signal level samples taken in the CMS operation described in FIG. 10B are provided for explanation purposes, and that in other examples, a different number of black level samples and/or a different number of signal level samples may also be taken in accordance with the teachings of the present invention The example depicted in FIG. 10B shows that processing begins with the feedback latch reset signal LAT_FB_RST 1058 being pulsed to reset the feedback latch stage 1032 and zero out any previous data latched in the feedback latch stage 1032. Next the comparator output signal CMPOUT 1050 pulses as the ramp signal 1014 ramps down, which causes the front end latch stage 1026 to latch the first black level sample value BLK1 as represented Gray code signal Q_GC<12:0> 1022.

Next, at time T1 in FIG. 10B, it is appreciated that the Hi/Lo 1066 signal high or equal to 1. Therefore, at time T1, the signal latch enable signal LAT_SIG_EN 1054 and pre-latch enable signal LAT_PRE_EN 1062 are pulsed, which causes the GC to binary/inverted stage 1030 to convert the Gray code Q_GC<12:0> 1022 latched in signal latch stage 1028 to an inverted binary representation of BLK1, which is coupled to be received at the first input "A" of the adder stage 1036. At the same time, the reset or zero value latched in the feedback latch stage 1032 is received at the second input "B" of the adder stage 1036. At this time, it is appreciated that the carry-in "CI" input of the LSB of the adder stage 1036 is coupled to receive a 1 (e.g., high) as the GC to binary/inverted binary stage 1030 is configured to generate the inverted binary representation of BLK1. As such, the adder stage 1036 is configured to determine the sum of (−BLK1) and 0, or (−BLK1)+0, which is latched into the pre-latch stage 1038.

Next, the −BLK1+0 value that is latched in the pre-latch stage 1038 is latched into feedback latch stage 1032 in response to the feedback latch enable signal LAT_FB_EN 1056.

Next the comparator output signal CMPOUT 1050 pulses a second time as the ramp signal 1014 ramps down, which causes the front end latch stage 1026 to latch the second black level sample value BLK2 as represented Gray code signal Q_GC<12:0> 1022.

Next, the signal latch enable signal LAT_SIG_EN 1054 and pre-latch enable signal LAT_PRE_EN 1062 are pulsed again, which causes the GC to binary/inverted binary stage 1030 to convert the Gray code Q_GC<12:0> 1022 latched in signal latch stage 1028 to an inverted binary representation of BLK2, which is coupled to be received at the first input "A" of the adder stage 1036. At the same time, the −BLK1 value latched in the feedback latch stage 1032 is received at the second input "B" of the adder stage 1036. At this time, it is appreciated that the carry-in "CI" input of the LSB of the adder stage 1036 is still coupled to receive a 1 (e.g., high) as the GC to binary/inverted binary stage 1030 is configured to generate the inverted binary representation of BLK2. As such, the adder stage 1036 is configured to determine the sum of (−BLK1) and (−BLK2), or ((−BLK1)+(−BLK2)), which is latched into the pre-latch stage 1038.

Next, at time T2 in FIG. 10B, the accumulated sum (e.g., (−BLK1)+(−BLK2)) that is latched in the pre-latch stage 638 is latched into feedback latch stage 1032 in response to the feedback latch enable signal LAT_FB_EN 1056. It is noted that the illustrated example describes two black level values, BLK1 and BLK2, being sampled. It is appreciated that the example above can be repeated as many times as desired to accumulate the sum of one or more samples in the pre-latch stage 1038 and feedback latch stage 1032 in accordance with the teachings of the present invention. As noted, with more black and/or signal level samples, improved signal to noise ratio performance can be achieved, but with a lower frame rate. Examples in accordance with the teachings of the present invention can support different numbers of black level and/or signal level samples in order to find a sweet spot for noise and speed.

Next, at time T3, it is noted that the Hi/Lo signal 1066 is now low for the remainder of the CMS processing example illustrated in FIG. 10B. At time T3, the comparator output signal CMPOUT 1050 pulses a third time as the ramp signal 1014 ramps down, which causes the front end latch stage 1026 to latch the first signal level sample value SIG1 as represented Gray code signal Q_GC<12:0> 1022.

Next, at time T4 in FIG. 10B, the signal latch enable signal LAT_SIG_EN 1054 and pre-latch enable signal LAT_PRE_EN 1062 are pulsed, which causes the GC to binary/inverted binary stage 1030 to convert the Gray code Q_GC<12:0> 1022 latched in signal latch stage 1028 to at binary representation of the Gray code Q_GC<12:0> 1022 latched in signal latch stage 1028, which is coupled to be received at the first input "A" of the adder stage 1036. At the same time, the accumulated sum of black signal level value samples, ((−BLK1)+(−BLK2)), is latched in the feedback latch stage 1032. At this time, it is appreciated that the carry-in "CI" input of the LSB of the adder stage 1036 is coupled to receive a 0 (e.g., low) as the GC to binary/inverted binary stage 1030 is configured to generate the binary representation of SIG1. As such, the adder stage 1036 is configured to determine the sum of SIG1 and ((−BLK1)+(−BLK2)), or SIG1+((−BLK1)+(−BLK2)), which is latched into the pre-latch stage 1038.

Next, at time T5, the sum that is latched in the pre-latch stage 1038 is latched into feedback latch stage 1032 in response to the feedback latch enable signal LAT_FB_EN 1056.

Next, at time T6, the comparator output signal CMPOUT 1050 pulses a fourth time as the ramp signal 1014 ramps down, which causes the front end latch stage 1026 to latch the second signal level sample value SIG2 as represented Gray code signal Q_GC<12:0> 1022.

Next, at time T7 in FIG. 10B, the signal latch enable signal LAT_SIG_EN 1054 and pre-latch enable signal LAT_PRE_EN 1062 are pulsed, which causes the GC to binary/inverted binary stage 1030 to convert the Gray code Q_GC<12:0> 1022 latched in signal latch stage 1028 to a binary representation of the Gray code Q_GC<12:0> 1022 latched in signal latch stage 1028, which is coupled to be received at the first input "A" of the adder stage 1036. At this time, it is appreciated that the carry-in "CI" input of the LSB of the adder stage 1036 is still coupled to receive a 0 (e.g., low) as the GC to binary/inverted binary stage 1030 is configured to generate the binary representation of SIG2. As such, the adder stage 1036 is configured to determine the sum of SIG2 and (SIG1+((−BLK1)+(−BLK2))), or ((SIG2+SIG1)+((−BLK1)+(−BLK2))), which is latched into the pre-latch stage 1038.

Next at time T8, the data latch enable signal LAT_DAT_EN 1064 is pulsed, which causes the CMS data ((SIG2+SIG1)+((−BLK1)+(−BLK2))) to be latched into data latch stage 1040, which may then be output to the global read bitline through transmission gate 1042-*n*.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An arithmetic logic unit (ALU), comprising:
   a front end latch stage coupled to a Gray code (GC) generator to latch GC outputs of the GC generator in response to a comparator output;
   a signal latch stage coupled to latch outputs of the front end latch stage in response to a signal latch enable signal;
   a GC to binary stage coupled to generate a binary representation of the GC outputs latched in the signal latch stage;
   an adder stage including first inputs and second inputs, wherein the first inputs of the adder stage are coupled to receive outputs of the GC to binary stage, wherein outputs of the adder stage are generated in response to the first inputs and the second inputs of the adder stage;
   a pre-latch stage coupled to latch outputs of the adder stage in response to a pre-latch enable signal; and
   a feedback latch stage coupled to latch outputs of the pre-latch stage in response to a feedback latch enable signal, wherein the second inputs of the adder stage are coupled to receive outputs of the feedback latch stage.

2. The ALU of claim 1, wherein the outputs of the feedback latch stage include first outputs and second outputs, wherein the first outputs of the feedback latch stage are the latched outputs of the pre-latch stage, wherein the second outputs of the feedback latch stage are inverted latched outputs of the pre-latch stage, wherein the ALU further comprises:
   a multiplexer stage coupled between the feedback latch stage and the adder stage, wherein the multiplexer is configured to couple either the first outputs or the second outputs of the feedback latch stage to the second inputs of the adder stage in response to an adder operation signal.

3. The ALU of claim 2, wherein a least significant bit (LSB) of the adder stage is coupled to receive a low value at a carry-in input when the multiplexer stage is configured to couple the first outputs of the feedback latch stage to the second inputs of the adder stage,
  wherein the LSB of the adder stage is further coupled to receive a high value at the carry-in input when the multiplexer stage is configured to couple the second outputs of the feedback latch stage to the second inputs of the adder stage.

4. The ALU of claim 3, wherein the adder stage is configured to add a feedback value latched in the feedback latch stage and the binary representation of the GC outputs latched in the signal latch stage when the multiplexer stage is configured to couple the first outputs of the feedback latch stage to the second inputs of the adder stage.

5. The ALU of claim 3, wherein the adder stage is configured to add a two's complement representation of a feedback value latched in the feedback latch stage and the binary representation of the GC outputs latched in the signal latch stage when the multiplexer stage is configured to couple the second outputs of the feedback latch stage to the second inputs of the adder stage.

6. The ALU of claim 1, wherein the GC outputs of the GC generator include N bits, wherein the GC to binary stage includes N exclusive-OR (XOR) gates,
  wherein first inputs of the N XOR gates are coupled to receive respective bits of the GC outputs of the GC generator,
  wherein second inputs of N−1 XOR gates corresponding to least N−1 significant bits of the GC outputs of the GC generator are coupled to receive respective outputs of nearest neighboring XOR gates corresponding to a higher bit value,
  wherein a second input of an Nth XOR gate corresponding to a most significant bit (MSB) of the GC outputs of the GC generator is coupled to receive a low value when the outputs of the N XOR gates of the GC to binary stage are configured to generate the binary representations of the GC outputs.

7. The ALU of claim 6, wherein the second input of the Nth XOR gate corresponding to the MSB of the GC outputs of the GC generator is coupled to receive a high value when the outputs of the N XOR gates of the GC to binary stage are configured to generate inverted binary representations of the GC outputs.

8. The ALU of claim 7, wherein a least significant bit (LSB) of the adder stage is coupled to receive a low value at a carry-in input when the second input of the Nth XOR gate corresponding to the MSB of the GC outputs of the GC generator is coupled to receive the low value,
  wherein the LSB of the adder stage is coupled to receive a high value at the carry-in input when the second input of the Nth XOR gate corresponding to the MSB of the GC outputs of the GC generator is coupled to receive the high value.

9. The ALU of claim 8, wherein the adder stage is configured to add the binary representation of the GC outputs latched in the signal latch stage and a feedback value latched in the feedback latch stage when the outputs of the N XOR gates of the GC to binary stage are configured to generate the binary representations of the GC outputs.

10. The ALU of claim 8, wherein the adder stage is configured to add a two's complement representation of the GC outputs latched in the signal latch stage and a feedback value latched in the feedback latch stage when the outputs of the N XOR gates of the GC to binary stage are configured to generate the inverted binary representations of the GC outputs.

11. The ALU of claim 1, further comprising a pulse generator coupled to generate a front end latch enable signal in response to the comparator output, wherein the front end latch stage is coupled to latch the GC outputs of the GC generator in response to the front end latch enable signal.

12. The ALU of claim 11, further comprising a bypass switch coupled between an input of the pulse generator and an output of the pulse generator, wherein the front end latch enable signal is substantially equal to the comparator output when the bypass switch is closed, wherein the front end latch enable signal is substantially equal to an output of the pulse generator when the bypass switch is opened.

13. The ALU of claim 1, wherein the feedback latch stage is configured to be reset in response to a feedback latch reset signal.

14. The ALU of claim 1, further comprising a data latch stage coupled to latch outputs of the pre-latch stage in response to a data latch enable signal.

15. The ALU of claim 1, wherein the ALU is one of a plurality of ALUs coupled to a pixel array of an imaging system, wherein the plurality of ALUs are configured to determine a difference between an accumulated sum of one or more signal level samples and an accumulated sum of one or more black level samples from each of a plurality of pixel circuits of the pixel array.

16. An imaging system, comprising:
  a pixel array including a plurality of pixel circuits arranged into rows and columns, wherein each one of the plurality of pixel circuits is coupled to generate an analog image data signal in response to incident light;
  control circuitry coupled to the pixel array to control operation of the pixel array; and
  a readout circuit coupled to the pixel array through a plurality of column bit lines, wherein the readout circuit comprises:
    a plurality of comparators, wherein each one of the plurality of comparators is coupled to receive a ramp signal, wherein each one of the plurality of comparators is further coupled to a respective one of a plurality of column bit lines to receive a respective analog image data signal, wherein each one of the plurality of comparators is coupled to generate a respective comparator output in response to a comparison of the respective analog image data signal and the ramp signal;
    a Gray code (GC) generator coupled to generate GC outputs; and
    a plurality of arithmetic logic units (ALUs), wherein each one of the plurality of ALUs is coupled to receive the GC outputs, wherein each one of the plurality of ALUs is further coupled to a respective one of the plurality of comparators to receive the respective comparator output, wherein each one of the plurality of ALUs comprises:
      a front end latch stage coupled to the GC generator to latch the GC outputs of the GC generator in response to the respective comparator output;
      a signal latch stage coupled to latch outputs of the front end latch stage in response to a signal latch enable signal;
      a GC to binary stage coupled to generate a binary representation of the GC outputs latched in the signal latch stage;
      an adder stage including first inputs and second inputs, wherein the first inputs of the adder stage are coupled to receive outputs of the GC to binary stage, wherein outputs of the adder stage are generated in response to the first inputs and the second inputs of the adder stage;

a pre-latch stage coupled to latch outputs of the adder stage in response to a pre-latch enable signal; and a feedback latch stage coupled to latch outputs of the pre-latch stage in response to a feedback latch enable signal, wherein the second inputs of the adder stage are coupled to receive outputs of the feedback latch stage.

17. The imaging system of claim 16, further comprising function logic coupled to the readout circuit to store the image data read out from the pixel array.

18. The imaging system of claim 16, wherein the outputs of the feedback latch stage include first outputs and second outputs, wherein the first outputs of the feedback latch stage are the latched outputs of the pre-latch stage, wherein the second outputs of the feedback latch stage are inverted latched outputs of the pre-latch stage, wherein each one of the plurality of ALUs further comprises:

a multiplexer stage coupled between the feedback latch stage and the adder stage, wherein the multiplexer is configured to couple either the first outputs or the second outputs of the feedback latch stage to the second inputs of the adder stage in response to an adder operation signal.

19. The imaging system of claim 18, wherein a least significant bit (LSB) of the adder stage is coupled to receive a low value at a carry-in input when the multiplexer stage is configured to couple the first outputs of the feedback latch stage to the second inputs of the adder stage, wherein the LSB of the adder stage is further coupled to receive a high value at the carry-in input when the multiplexer stage is configured to couple the second outputs of the feedback latch stage to the second inputs of the adder stage.

20. The imaging system of claim 19, wherein the adder stage is configured to add a feedback value latched in the feedback latch stage and the binary representation of the GC outputs latched in the signal latch stage when the multiplexer stage is configured to couple the first outputs of the feedback latch stage to the second inputs of the adder stage.

21. The imaging system of claim 19, wherein the adder stage is configured to add a two's complement representation of a feedback value latched in the feedback latch stage and the binary representation of the GC outputs latched in the signal latch stage when the multiplexer stage is configured to couple the second outputs of the feedback latch stage to the second inputs of the adder stage.

22. The imaging system of claim 16, wherein the GC outputs of the GC generator include N bits, wherein the GC to binary stage includes N exclusive-OR (XOR) gates, wherein first inputs of the N XOR gates are coupled to receive respective bits of the GC outputs of the GC generator, wherein second inputs of N−1 XOR gates corresponding to least N−1 significant bits of the GC outputs of the GC generator are coupled to receive respective outputs of nearest neighboring XOR gates corresponding to a higher bit value, wherein a second input of an Nth XOR gate corresponding to a most significant bit (MSB) of the GC outputs of the GC generator is coupled to receive a low value when the outputs of the N XOR gates of the GC to binary stage are configured to generate the binary representations of the GC outputs.

23. The imaging system of claim 22, wherein the second input of the Nth XOR gate corresponding to the MSB of the GC outputs of the GC generator is coupled to receive a high value when the outputs of the N XOR gates of the GC to binary stage are configured to generate inverted binary representations of the GC outputs.

24. The imaging system of claim 23, wherein a least significant bit (LSB) of the adder stage is coupled to receive a low value at a carry-in input when the second input of the Nth XOR gate corresponding to the MSB of the GC outputs of the GC generator is coupled to receive the low value, wherein the LSB of the adder stage is coupled to receive a high value at the carry-in input when the second input of the Nth XOR gate corresponding to the MSB of the GC outputs of the GC generator is coupled to receive the high value.

25. The imaging system of claim 24, wherein the adder stage is configured to add the binary representation of the GC outputs latched in the signal latch stage and a feedback value latched in the feedback latch stage when the outputs of the N XOR gates of the GC to binary stage are configured to generate the binary representations of the GC outputs.

26. The imaging system of claim 24, wherein the adder stage is configured to add a two's complement representation of the GC outputs latched in the signal latch stage and a feedback value latched in the feedback latch stage when the outputs of the N XOR gates of the GC to binary stage are configured to generate the inverted binary representations of the GC outputs.

27. The imaging system of claim 16, wherein each one of the plurality of ALUs further comprises a pulse generator coupled to generate a front end latch enable signal in response to the respective comparator output, wherein the front end latch stage is coupled to latch the GC outputs of the GC generator in response to the front end latch enable signal.

28. The imaging system of claim 27, wherein each one of the plurality of ALUs further comprises a bypass switch coupled between an input of the pulse generator and an output of the pulse generator, wherein the front end latch enable signal is substantially equal to the respective comparator output when the bypass switch is closed, wherein the front end latch enable signal is substantially equal to an output of the pulse generator when the bypass switch is opened.

29. The imaging system of claim 16, wherein the feedback latch stage is configured to be reset in response to a feedback latch reset signal.

30. The imaging system of claim 16, wherein each one of the plurality of ALUs further comprises a data latch stage coupled to latch outputs of the pre-latch stage in response to a data latch enable signal.

31. The imaging system of claim 16, wherein the plurality of ALUs are configured to determine a difference between an accumulated sum of one or more signal level samples and an accumulated sum of one or more black level samples from each of the plurality of pixel circuits of the pixel array.

* * * * *